(12) United States Patent
Yanagidaira et al.

(10) Patent No.: US 11,302,399 B2
(45) Date of Patent: Apr. 12, 2022

(54) SEMICONDUCTOR STORAGE DEVICE AND READING METHOD THEREOF

(71) Applicant: KIOXIA CORPORATION, Tokyo (JP)

(72) Inventors: Kosuke Yanagidaira, Kanagawa (JP); Takuyo Kodama, Kanagawa (JP); Takeshi Hioka, Tokyo (JP)

(73) Assignee: KIOXIA CORPORATION, Tokyo (JP)

(*) Notice: Subject to any disclaimer, the term of this patent is extended or adjusted under 35 U.S.C. 154(b) by 19 days.

(21) Appl. No.: 17/008,337

(22) Filed: Aug. 31, 2020

(65) Prior Publication Data

US 2021/0264989 A1    Aug. 26, 2021

(30) Foreign Application Priority Data

Feb. 20, 2020    (JP) .............................. JP2020-027018

(51) Int. Cl.
| | |
|---|---|
| *G11C 16/34* | (2006.01) |
| *G11C 16/26* | (2006.01) |
| *G11C 16/08* | (2006.01) |
| *G11C 16/04* | (2006.01) |
| *H01L 27/115* | (2017.01) |

(52) U.S. Cl.
CPC .......... *G11C 16/26* (2013.01); *G11C 16/0483* (2013.01); *G11C 16/08* (2013.01); *H01L 27/115* (2013.01)

(58) Field of Classification Search
CPC ...................................................... G11C 16/34
USPC ..................................................... 365/185.17
See application file for complete search history.

(56) References Cited

U.S. PATENT DOCUMENTS

| | | | |
|---|---|---|---|
| 2005/0162913 | A1 | 7/2005 | Chen |
| 2008/0019188 | A1 | 1/2008 | Li |
| 2009/0073763 | A1 | 3/2009 | Hosono |
| 2009/0073771 | A1 | 3/2009 | Li |
| 2016/0322110 | A1 | 11/2016 | Abiko et al. |
| 2020/0090769 | A1* | 3/2020 | Maeda ................ G11C 11/5635 |

* cited by examiner

*Primary Examiner* — Jason Lappas
(74) *Attorney, Agent, or Firm* — Kim & Stewart LLP

(57) ABSTRACT

A semiconductor storage device includes first and second memory cells, first and second word lines connected to the first and second memory cells, respectively, a bit line connected to the first and second memory cells, and a sense amplifier including a sense node. During a first read, a controller applies a first read voltage to the second word line and determines a read result. During a second read, the controller discharges the sense node for a first time period while applying a second read voltage to the first word line to determine a first read result, and discharges the sense node for a second time period while applying the second read voltage to determine a second read result. The controller determines read data based on the first read result, the second read result, and the read result of the second memory cell.

20 Claims, 21 Drawing Sheets

FIG. 9A
EXAMPLE OF PROGRAMMING FROM SOURCE-SIDE TO DRAIN-SIDE

|  | SU0 | SU1 | SU2 | SU3 |
|---|---|---|---|---|
| WL7 | 29 | 30 | 31 | 32 |
| WL6 | 25 | 26 | 27 | 28 |
| WL5 | 21 | 22 | 23 | 24 |
| WL4 | 17 | 18 | 19 | 20 |
| WL3 | 13 | 14 | 15 | 16 |
| WL2 | 9 | 10 | 11 | 12 |
| WL1 | 5 | 6 | 7 | 8 |
| WL0 | 1 | 2 | 3 | 4 |

FIG. 9B
EXAMPLE OF PROGRAMMING FROM DRAIN-SIDE TO SOURCE-SIDE

|  | SU0 | SU1 | SU2 | SU3 |
|---|---|---|---|---|
| WL7 | 1 | 2 | 3 | 4 |
| WL6 | 5 | 6 | 7 | 8 |
| WL5 | 9 | 10 | 11 | 12 |
| WL4 | 13 | 14 | 15 | 16 |
| WL3 | 17 | 18 | 19 | 20 |
| WL2 | 21 | 22 | 23 | 24 |
| WL1 | 25 | 26 | 27 | 28 |
| WL0 | 29 | 30 | 31 | 32 |

FIG. 13
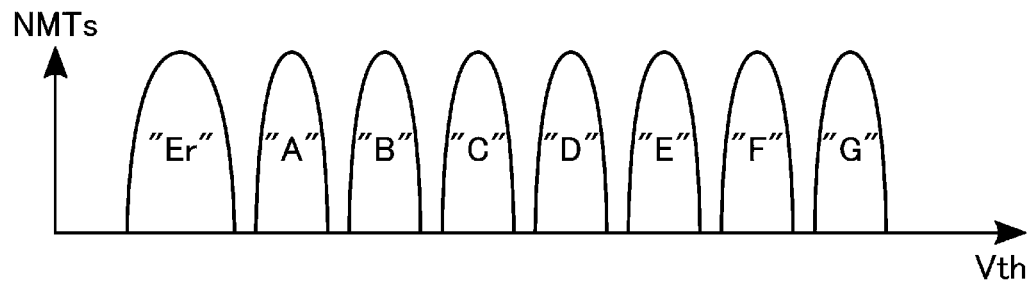
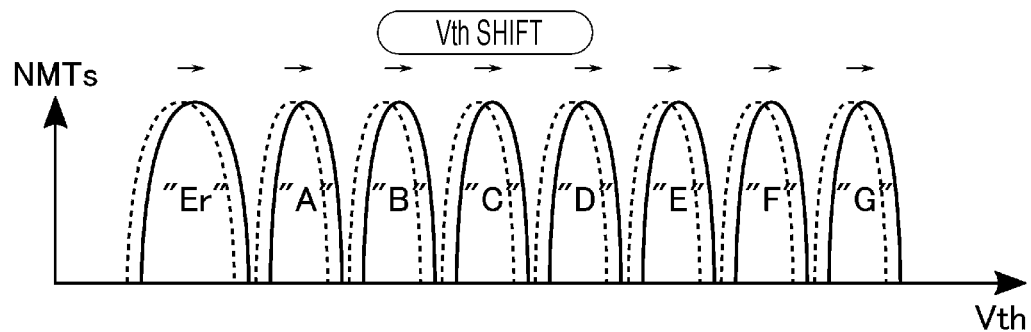

DLA READ OPERATION OF LOWER PAGE (SECOND MODIFICATION OF FIRST EMBODIMENT)

DLA READ OPERATION OF LOWER PAGE (FIRST MODIFICATION OF SECOND EMBODIMENT)

ary of a read operation in the semicon-# SEMICONDUCTOR STORAGE DEVICE AND READING METHOD THEREOF

CROSS-REFERENCE TO RELATED APPLICATION(S)

This application is based upon and claims the benefit of priority from Japanese Patent Application No. 2020-027018, filed on Feb. 20, 2020, the entire contents of which are incorporated herein by reference.

FIELD

Embodiments described herein relate generally to a semiconductor storage device and a reading method thereof.

BACKGROUND

A NAND-type flash memory capable of storing data in a non-volatile manner is known.

BRIEF DESCRIPTION OF THE DRAWINGS

FIGS. 9A and 9B are tables illustrating an example of the order in which write operations are executed in the semiconductor storage device according to the first embodiment.

FIG. 13 is a conceptual diagram illustrating an example of threshold voltage distribution of memory cell transistors in the semiconductor storage device according to the first embodiment.

DETAILED DESCRIPTION

Figure 1:
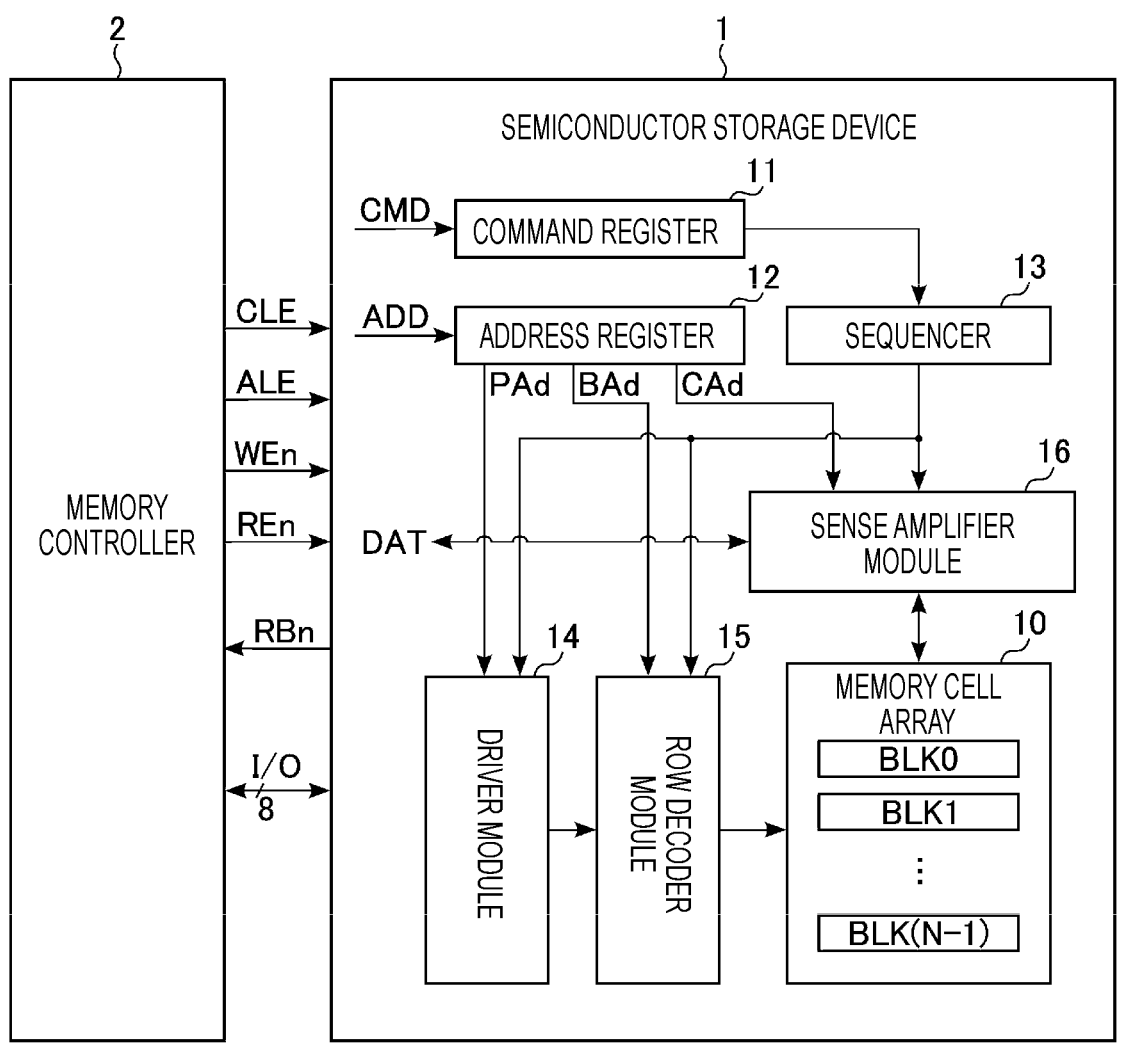
FIG. 1 is a block diagram illustrating a configuration example of a semiconductor storage device according to a first embodiment.

In general, according to one embodiment, a semiconductor storage device includes first and second memory cells, first and second word lines, a bit line, and a sense amplifier. The first and second memory cells are connected in series. The first word line is connected to the first memory cell. The second word line is connected to the second memory cell. The bit line is connected to the first and second memory cells which are connected in series. The first sense amplifier includes a sense node and a transistor connected between the sense node and the bit line. A controller performs a read operation including a first read and a second read. In the read operation in which the first word line is selected, the controller applies a first read voltage to the second word line during the first read, discharges the sense node through the transistor while applying the first read voltage, and determines a read result of the second memory cell based on the voltage of the discharged sense node. The controller applies the second read voltage to the first word line during the second read, discharges the sense node through the transistor for a first time period while applying the second read voltage, and determines a first read result of the first memory cell based on the voltage of the sense node discharged for the first time period. The controller discharges the sense node through the transistor for a second time period different from the first time period while applying the second read voltage, and determines a second read result of the first memory cell based on the voltage of the sense node discharged for the second time period. The controller outputs read data based on the first read result or the second read result of the first memory cell to an external memory controller based on the read result of the second memory cell.

Embodiments will be described below with reference to the drawings. Each of the embodiments exemplifies an apparatus or method for embodying the technical idea of the present disclosure. The drawings are schematic or conceptual, and the dimensions and proportions of the drawings are not necessarily the same as the actual ones. The technical idea of the present disclosure is not limited by the particular shape, structure, and arrangement of the elements described herein.

In the following description, elements having substantially the same functions and configurations are designated by the same reference numerals. The numbers after the characters that constitute the reference numerals are referred to by reference numerals containing the same characters, and are used to distinguish elements having the same configuration. When it is not necessary to distinguish elements denoted by reference numerals containing the same characters from each other, each of these elements is referred to by a reference numeral containing only the characters.

[1] First Embodiment

A semiconductor storage device 1 according to a first embodiment will be described below.

[1-1] Configuration of Semiconductor Storage Device 1

[1-1-1] Entire Configuration of Semiconductor Storage Device 1

FIG. 1 illustrates a configuration example of the semiconductor storage device 1 according to the first embodiment. The semiconductor storage device 1 is a NAND-type flash memory capable of storing data in a non-volatile manner, and may be controlled by an external memory controller 2. As illustrated in FIG. 1, the semiconductor storage device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLK (N-1) (N is an integer of 1 or more). The block BLK includes a set of a plurality of memory cells capable of storing data in a non-volatile manner and is used as, for example, a data erasing unit. Further, the memory cell array 10 is provided with a plurality of bit lines and a plurality of word lines. Each of the memory cells is associated with, for example, one bit line and one word line. The detailed configuration of the memory cell array 10 will be described later.

The command register 11 stores a command CMD that the semiconductor storage device 1 receives from the memory controller 2. The command CMD includes, for example, an instruction that causes the sequencer 13 to execute a read operation, a write operation, and an erase operation.

The address register 12 stores address information ADD received by the semiconductor storage device 1 from the memory controller 2. The address information ADD includes, for example, a block address BAd, a page address PAd, and a column address CAd. For example, the block address BAd, the page address PAd, and the column address CAd are used to select the block BLK, the word line, and the bit line, respectively.

The sequencer 13 controls the entire operation of the semiconductor storage device 1. For example, the sequencer 13 controls the driver module 14, the row decoder module 15, and the sense amplifier module 16 based on the command CMD stored in the command register 11 to execute a read operation, a write operation, and an erase operation.

The driver module 14 generates a voltage used in a read operation, a write operation, and an erase operation. Then, the driver module 14 applies the generated voltage to the signal line corresponding to the selected word line, for example, based on the page address PAd stored in the address register 12.

The row decoder module 15 selects one block BLK in the corresponding memory cell array 10 based on the block address BAd stored in the address register 12. Then, the row decoder module 15 transfers, for example, the voltage applied to the signal line corresponding to the selected word line to the selected word line in the selected block BLK.

In the write operation, the sense amplifier module 16 applies a desired voltage to each bit line according to the write data DAT received from the memory controller 2. Further, in the read operation, the sense amplifier module 16 determines the data stored in the memory cell based on the voltage of the bit line, and transfers the determination result to the memory controller 2 as the read data DAT.

Communication between the semiconductor storage device 1 and the memory controller 2 conforms to, for example, the NAND interface standard. For example, in communication between the semiconductor storage device 1 and the memory controller 2, a command latch enable signal CLE, an address latch enable signal ALE, a write enable signal WEn, a read enable signal REn, a ready busy signal RBn, and an input/output signal I/O are used.

The command latch enable signal CLE is a signal indicating that the input/output signal I/O received by the semiconductor storage device 1 is the command CMD. The address latch enable signal ALE is a signal indicating that the input/output signal I/O received by the semiconductor storage device 1 is the address information ADD. The write enable signal WEn is a signal for instructing the semiconductor storage device 1 to input the input/output signal I/O. The read enable signal REn is a signal that instructs the semiconductor storage device 1 to output the input/output signal I/O. The ready/busy signal RBn is a signal for notifying the memory controller 2 whether the semiconductor storage device 1 is in a ready state or a busy state. The ready state is a state in which the semiconductor storage device 1 can accept an instruction, and the busy state is a state in which the semiconductor storage device 1 cannot accept an instruction. The input/output signal I/O is, for example, a signal having a width of 8 bits and may include the command CMD, the address information ADD, and the data DAT.

The semiconductor storage device 1 and the memory controller 2 described above may be combined into a single semiconductor device. Examples of such a semiconductor device include a memory card such as an SD™ card and a solid state drive (SSD).

[1-1-2] Circuit Configuration of Semiconductor Storage Device 1

(Circuit Configuration of Memory Cell Array 10)

Figure 2:
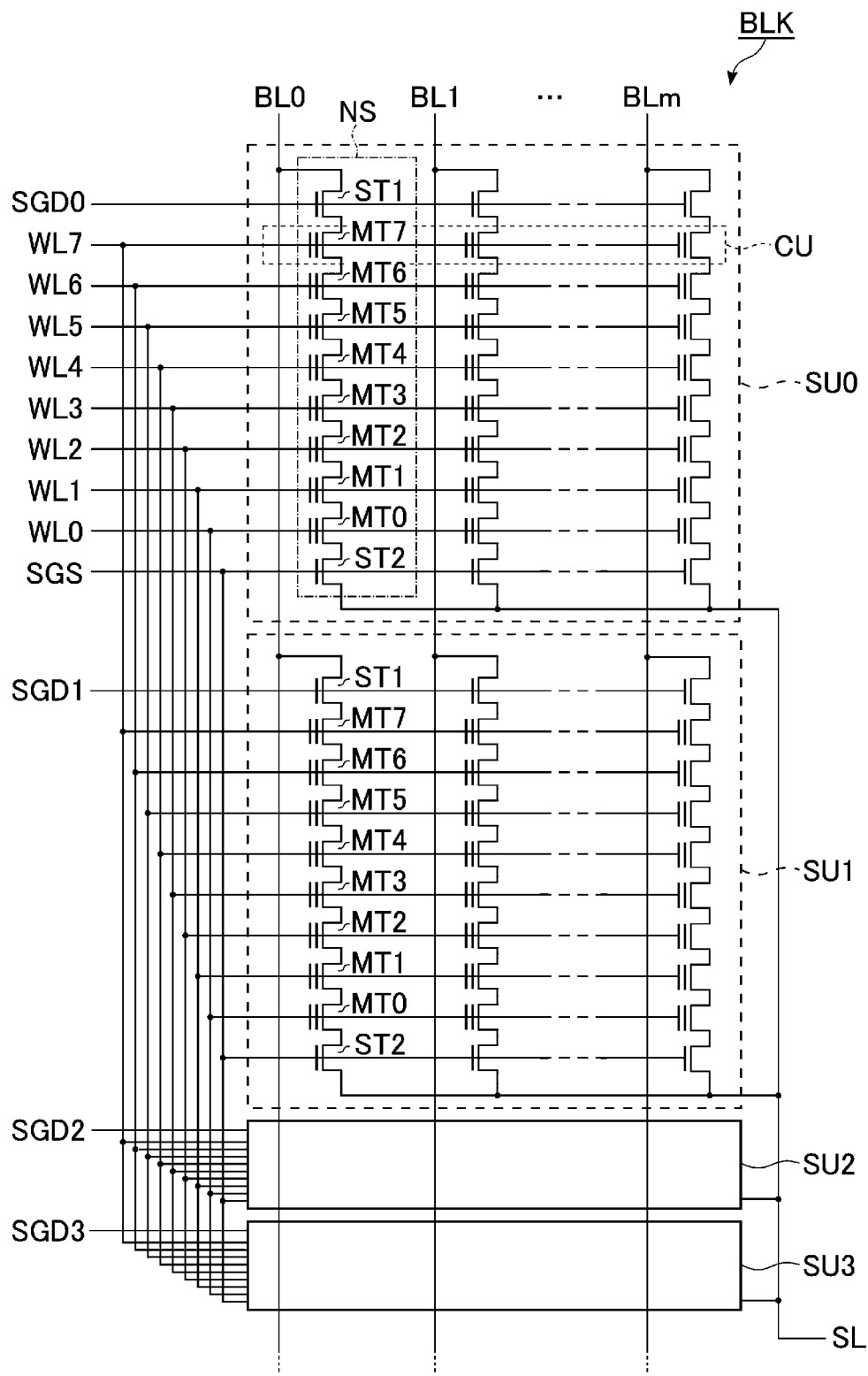
FIG. 2 is a circuit diagram illustrating an example of a circuit configuration of a memory cell array in the semiconductor storage device according to the first embodiment.

FIG. 2 illustrates an example of a circuit configuration of the memory cell array 10 in the semiconductor storage device 1 according to the first embodiment, in which one block BLK is extracted from a plurality of blocks BLK in the memory cell array 10. As illustrated in FIG. 2, the block BLK includes, for example, four string units SU0 to SU3.

Each of the string units SU includes a plurality of NAND strings NS respectively associated with bit lines BL0 to BLm (m is an integer of 1 or more). Each of the NAND strings NS includes, for example, memory cell transistors MT0 to MT7 and select transistors ST1 and ST2. The memory cell transistor MT includes a control gate and a charge storage layer and stores data in a non-volatile manner. Each of the select transistors ST1 and ST2 is used to select the string unit SU during various operations.

In each of the NAND strings NS, the memory cell transistors MT0 to MT7 are connected in series. A drain of the select transistor ST1 is connected to the associated bit line BL, and a source of the select transistor ST1 is connected to one end of the memory cell transistors MT0 to MT7 connected in series. A drain of the select transistor ST2 is connected to the other end of the memory cell transistors MT0 to MT7 connected in series. A source of the select transistor ST2 is connected to the source line SL.

In the same block BLK, the control gates of the memory cell transistors MT0 to MT7 are commonly connected to the word lines WL0 to WL7, respectively. The gates of the select transistors ST1 in the string units SU0 to SU3 are commonly connected to select gate lines SGD0 to SGD3, respectively. The gates of the select transistors ST2 in the same block BLK are commonly connected to the select gate line SGS.

In the circuit configuration of the memory cell array 10 described above, the bit line BL is shared by the NAND strings NS to which the same column address is assigned in each string unit SU. The source line SL is shared by, for example, a plurality of blocks BLK.

A set of a plurality of memory cell transistors MT connected to a common word line WL in one string unit SU is called, for example, a cell unit CU. For example, a storage capacity of the cell unit CU including the memory cell transistors MT that each stores 1-bit data is defined as "1 page data". The cell unit CU may have a storage capacity of two page data or more depending on the number of bits of data stored in the memory cell transistor MT.

Meanwhile, the circuit configuration of the memory cell array 10 in the semiconductor storage device 1 according to the first embodiment is not limited to the configuration described above. For example, the number of string units SU in each block BLK and the number of memory cell transistors MT and select transistors ST1 and ST2 in each NAND string NS is not limited to any number.

(Circuit Configuration of Row Decoder Module 15)

Figure 3:
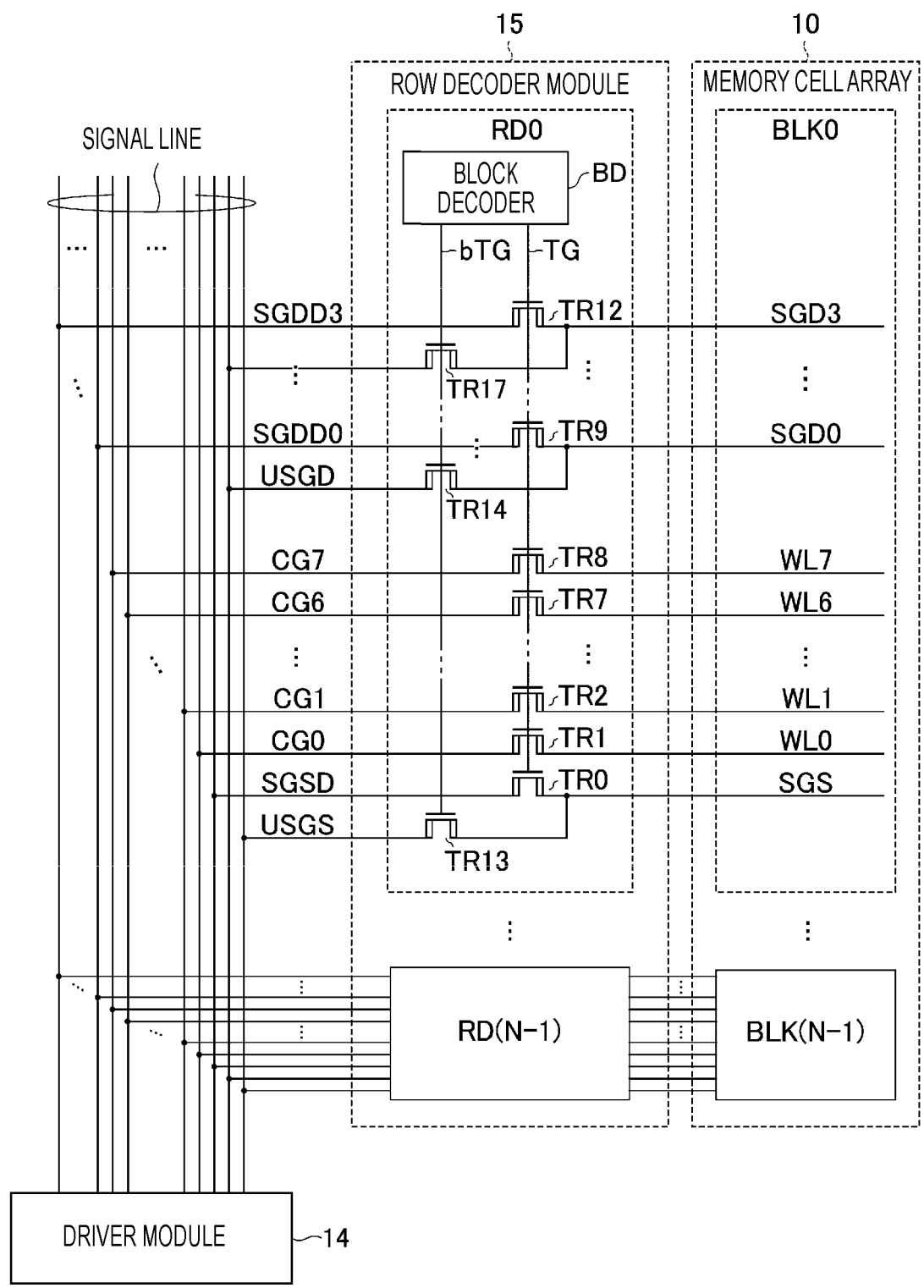
FIG. 3 is a circuit diagram illustrating an example of a circuit configuration of a row decoder module in the semiconductor storage device according to the first embodiment.

FIG. 3 illustrates an example of a circuit configuration of the row decoder module 15 in the semiconductor storage device 1 according to the first embodiment. As illustrated in FIG. 3, the row decoder module 15 includes, for example, row decoders RD0 to RD(N-1), and is connected to the driver module 14 via signal lines CG0 to CG7, SGDD0 to SGDD3, SGSD, USGD, and USGS. The row decoders RD0 to RD(N-1) are associated with blocks BLK0 to BLK(N-1), respectively.

The detailed circuit configuration of the row decoder RD will be described below, focusing on the row decoder RD0 corresponding to the block BLK0. The row decoder RD includes, for example, a block decoder BD, transfer gate lines TG and bTG, and transistors TR0 to TR17.

The block decoder BD decodes the block address BAd. Then, the block decoder BD applies a predetermined voltage to each of the transfer gate lines TG and bTG based on the decoding result. The voltage applied to the transfer gate line TG and the voltage applied to the transfer gate line bTG have a complementary relationship. In other words, an inverted signal of the transfer gate line TG is input to the transfer gate line bTG.

Each of the transistors TR0 to TR17 is a high breakdown voltage N-type MOS transistor. The respective gates of the transistors TR0 to TR12 are commonly connected to the transfer gate line TG. The respective gates of the transistors TR13 to TR17 are commonly connected to the transfer gate line bTG. Further, each transistor TR is connected between the signal line wired from the driver module 14 and the wiring provided in the corresponding block BLK.

Specifically, the drain of the transistor TR0 is connected to the signal line SGSD. The source of the transistor TR0 is connected to the select gate line SGS. The drains of the transistors TR1 to TR8 are connected to the signal lines CG0 to CG7, respectively. The sources of the transistors TR1 to TR8 are connected to the word lines WL0 to WL7, respectively. The drains of the transistors TR9 to TR12 are connected to the signal lines SGDD0 to SGDD3, respectively. The sources of the transistors TR9 to TR12 are connected to the select gate lines SGD0 to SGD3, respectively. The drain of the transistor TR13 is connected to the signal line USGS. The source of the transistor TR13 is connected to the select gate line SGS. The drains of the transistors TR14 to TR17 are commonly connected to the signal line USGD. The sources of the transistors TR14 to TR17 are connected to the select gate lines SGD0 to SGD3, respectively.

That is, the signal lines CG0 to CG7 are used as global word lines shared among the plurality of blocks BLK, and the word lines WL0 to WL7 are used as local word lines provided for each block BLK. Further, the signal lines SGDD0 to SGDD3 and SGSD are used as global transfer gate lines shared among the plurality of blocks BLK, and the select gate lines SGD0 to SGD3 and SGS are used as local transfer gate lines provided for each block BLK.

With the above configuration, the row decoder module 15 may select the block BLK. Specifically, during various operations, the block decoder BD corresponding to the selected block BLK applies voltages of "H" level and "L" level to the transfer gate lines TG and bTG, respectively, and the block decoder BD corresponding to the non-selected block BLK applies voltages of "L" level and "H" level to the transfer gate lines TG and bTG, respectively.

The circuit configuration of the row decoder module 15 described above is merely an example, and may be changed as appropriate. For example, the number of transistors TR in the row decoder module 15 is designed to be the number based on the number of wirings provided in each block BLK.

(Circuit Configuration of Sense Amplifier Module 16)

Figure 4:
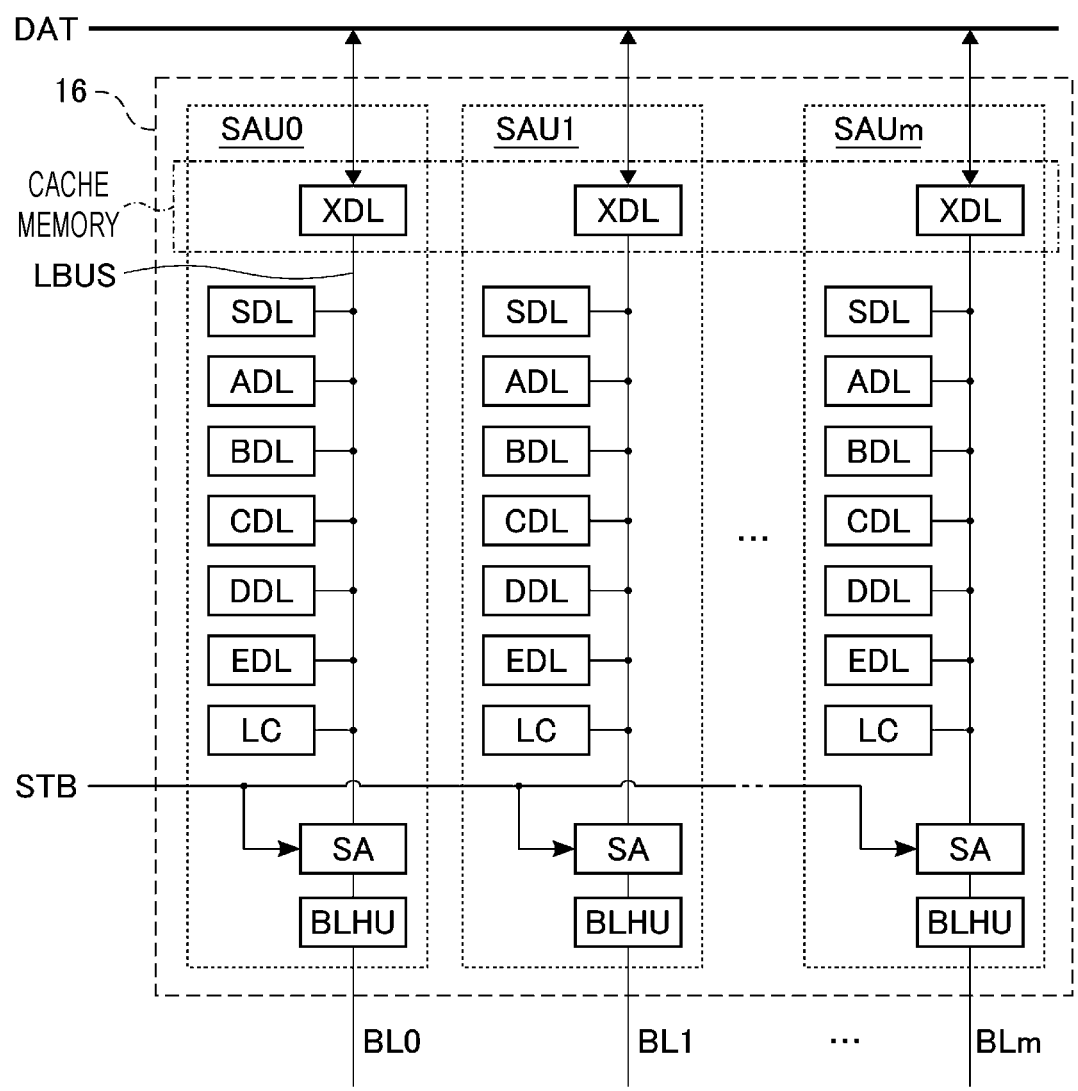
FIG. 4 is a circuit diagram illustrating an example of a circuit configuration of a sense amplifier module in the semiconductor storage device according to the first embodiment.

FIG. 4 illustrates an example of a circuit configuration of the sense amplifier module 16 in the semiconductor storage device 1 according to the first embodiment. As illustrated in FIG. 4, each sense amplifier unit SAU includes, for example, a bit line connection unit BLHU, a sense amplifier SA, a logic circuit LC, and latch circuits SDL, ADL, BDL, CDL, DDL, EDL, and XDL.

The bit line connection unit BLHU includes a high breakdown voltage transistor connected between the associated bit line BL and the sense amplifier SA. The sense amplifier SA, the logic circuit LC, and the latch circuits SDL, ADL, BDL, CDL, DDL, EDL, and XDL are commonly connected to a bus LBUS. The latch circuits SDL, ADL, BDL, CDL, DDL, EDL, and XDL may send and receive data to and from each other.

A control signal STB generated by, for example, the sequencer 13 is commonly input to the sense amplifiers SA of the respective sense amplifier units SAU. Then, the sense amplifier SA determines whether the data read to the associated bit line BL is "0" or "1" based on the timing the control signal STB is asserted. That is, the sense amplifier SA determines the data stored in the selected memory cell based on the voltage of the bit line BL.

The logic circuit LC executes various logic operations using the data stored in the latch circuits SDL, ADL, BDL, CDL, DDL, EDL, and XDL connected to the common bus LBUS. Specifically, for example, the logic circuit LC uses the data stored in two latch circuits among the latch circuits provided in each sense amplifier unit SAU to perform an AND operation, an OR operation, a NAND operation, a NOR operation, an EXNOR operation.

Each of the latch circuits SDL, ADL, BDL, CDL, DDL, EDL, and XDL temporarily stores data. The latch circuit XDL is used for input/output of data DAT between the input/output circuit of the semiconductor storage device 1 and the sense amplifier unit SAU. Further, the latch circuit XDL may also be used as, for example, a cache memory of the semiconductor storage device 1. The semiconductor storage device 1 may be in the ready state when at least the latch circuit XDL is empty.

Figure 5:
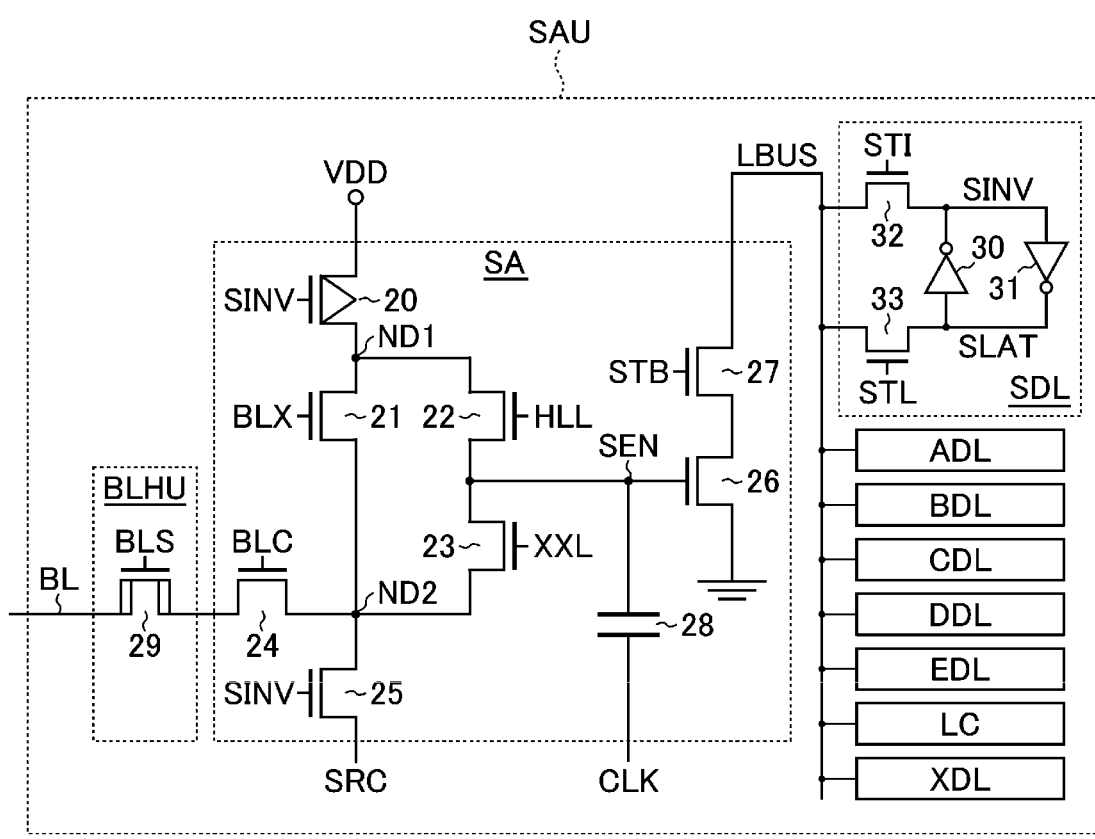
FIG. 5 is a circuit diagram illustrating an example of a circuit configuration of a sense amplifier unit that is in the sense amplifier module of the semiconductor storage device according to the first embodiment.

FIG. 5 illustrates an example of a circuit configuration of the sense amplifier unit SAU in the semiconductor storage device 1 according to the first embodiment. As illustrated in FIG. 5, for example, the sense amplifier SA includes transistors 20 to 27 and a capacitor 28, and the bit line connection unit BLHU includes a transistor 29. The transistor 20 is a P-type MOS transistor. Each of the transistors 21 to 27 is an N-type MOS transistor. The transistor 29 is an N-type MOS transistor having a higher breakdown voltage than each of the transistors 20 to 27.

The source of the transistor 20 is connected to a power supply line. The drain of the transistor 20 is connected to a node ND1. The gate of the transistor 20 is connected to a node SINV in, for example, the latch circuit SDL. The drain of the transistor 21 is connected to the node ND1. The source of the transistor 21 is connected to a node ND2. A control signal BLX is input to the gate of the transistor 21. The drain of the transistor 22 is connected to the node ND1. The source of the transistor 22 is connected to a node SEN. A control signal HLL is input to the gate of the transistor 22.

The drain of the transistor 23 is connected to the node SEN. The source of the transistor 23 is connected to the node ND2. A control signal XXL is input to the gate of the transistor 23. The drain of the transistor 24 is connected to the node ND2. A control signal BLC is input to the gate of the transistor 24. The drain of the transistor 25 is connected to the node ND2. The source of the transistor 25 is connected to a node SRC. The gate of the transistor 25 is connected to, for example, the node SINV in the latch circuit SDL.

The source of the transistor 26 is grounded. The gate of the transistor 26 is connected to the node SEN. The drain of the transistor 27 is connected to the bus LBUS. The source of the transistor 27 is connected to the drain of the transistor 26. The control signal STB is input to the gate of the transistor 27. One electrode of the capacitor 28 is connected to the node SEN. A clock CLK is input to the other electrode of the capacitor 28.

The drain of the transistor 29 is connected to the source of the transistor 24. The source of the transistor 29 is connected to the bit line BL. A control signal BLS is input to the gate of the transistor 29.

The latch circuit SDL includes, for example, inverters 30 and 31, and N-type MOS transistors 32 and 33. An input node of the inverter 30 is connected to a node SLAT, and an output node of the inverter 30 is connected to the node SINV. An input node of the inverter 31 is connected to the node SINV, and an output node of the inverter 31 is connected to the node SLAT. One end of the transistor 32 is connected to the node SINV, the other end of the transistor 32 is connected to the bus LBUS, and a control signal STI is input to the gate of the transistor 32. One end of the transistor 33 is connected to the node SLAT, the other end of the transistor 33 is connected to the bus LBUS, and a control signal STL is input to the gate of the transistor 33. For example, the data stored in the node SLAT corresponds to the data stored in the latch circuit SDL, and the data stored in the node SINV corresponds to the inverted data of the data stored in the node SLAT.

The circuit configuration of the latch circuits ADL, BDL, CDL, DDL, EDL, and XDL is the same as, for example, that of the latch circuit SDL. For example, the latch circuit ADL stores data at a node ALAT and its inverted data at a node AINV. Further, for example, a control signal ATI is input to the gate of the transistor 32 of the latch circuit ADL, and a control signal ATL is input to the gate of the transistor 33 of the latch circuit ADL. The description of the latch circuits BDL, CDL, DDL, EDL, and XDL is omitted because it is similar to that of the latch circuit ADL.

In the circuit configuration of the sense amplifier unit SAU described above, for example, a power supply voltage VDD is applied to the power supply line connected to the source of the transistor 20. For example, a ground voltage VSS is applied to a node SRC. Each of the control signals BLX, HLL, XXL, BLC, STB, and BLS, and the clock CLK is generated by, for example, the sequencer 13. As the sense amplifier module 16 includes the plurality of sense amplifier units SAU, each of the power supply voltage VDD, the ground voltage VSS, the control signals BLX, HLL, XXL, BLC, STB, and BLS, and the clock CLK are commonly supplied/input to the sense amplifiers SA of the respective sense amplifier units SAU. The node SEN may be called a sense node of the sense amplifier SA.

The sense amplifier module 16 in the semiconductor storage device 1 according to the first embodiment is not limited to the circuit configuration described above. For example, the number of latch circuits in each sense amplifier unit SAU may be appropriately changed based on the number of pages stored in one cell unit CU. The logic circuit LC in the sense amplifier unit SAU may be omitted when it is possible to execute a logical operation only by the latch circuits in the sense amplifier unit SAU.

[1-1-3] Structure of Semiconductor Storage Device 1

An example of the structure of the memory cell array 10 in the semiconductor storage device 1 according to the first embodiment will be described below. In the drawings referred to below, the X direction corresponds to the extending direction of a select gate line SGD, the Y direction corresponds to the extending direction of the bit line BL, and the Z direction corresponds to the vertical direction (stacking direction) with respect to the surface of a semiconductor substrate used to form the semiconductor storage device 1. In the cross-sectional view, hatching of insulating layers is appropriately omitted in order to avoid making the drawings complicated. Hatching is appropriately added to the plan view in order to make the drawings easy to see. The hatching added to the plan view is not necessarily related to the material and characteristics of the hatched component.

(Sectional Structure of Memory Cell Transistor MT)

Figure 6:
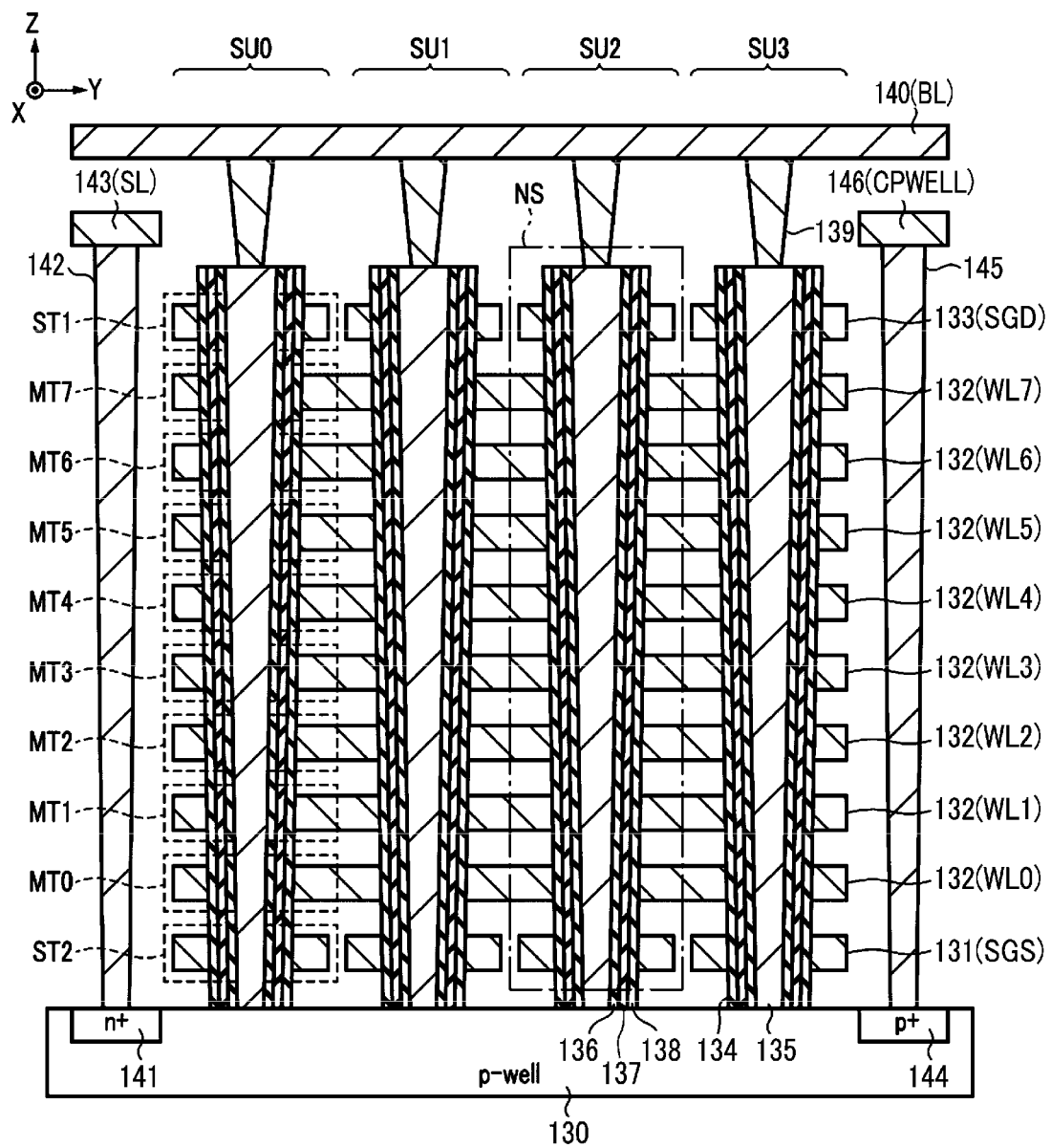
FIG. 6 is a cross-sectional view illustrating an example of a sectional structure of the memory cell array in the semiconductor storage device according to the first embodiment.

An example of the structure of the semiconductor storage device 1 according to the first embodiment will be described below with reference to FIG. 6. FIG. 6 is a cross-sectional view of a partial region of the block BLK.

As illustrated in FIG. 6, a p-type well region (p-well) 130 is provided in a semiconductor layer. A plurality of NAND strings NS is provided on the p-type well region 130. That is, a wiring layer 131 that functions as the select gate line SGS, eight wiring layers 132 that function as the word lines WL0 to WL7, and a wiring layer 133 that functions as the select gate line SGD are stacked in this order on the p-type well region 130. An insulating layer is provided between the adjacent wiring layers.

A memory hole 134 penetrates the wiring layers 131, 132, and 133, and the bottom of the memory hole 134 reaches the well region 130. A pillar-shaped semiconductor layer (semiconductor pillar) 135 is provided in the memory hole 134. An insulating film (tunnel insulating film) 136, an insulating film (charge storage layer) 137, and an insulating film (block insulating film) 138 are sequentially provided on the side surface of the semiconductor pillar 135. These films form the memory cell transistor MT and the select transistors ST1 and ST2. The semiconductor pillar 135 functions as a current path of the NAND string NS and is a region where the channel of each transistor is formed. An upper end of the semiconductor pillar 135 is connected to a metal wiring layer 140 functioning as the bit line BL via a contact plug 139.

An n+ type diffusion region 141 into which a high concentration of n-type impurities is introduced is provided in a surface region of the well region 130. A contact plug 142 is provided on the n+ type diffusion region 141. The contact plug 142 is connected to a metal wiring layer 143 functioning as the source line SL. Further, a p+ type diffusion region 144 into which a high concentration of p-type impurities is introduced is provided in the surface region of the well region 130. A contact plug 145 is provided on the p+ type diffusion region 144. The contact plug 145 is connected to a metal wiring layer 146 that functions as a well wiring CPWELL. The well wiring CPWELL is a wiring for applying a voltage to the semiconductor pillar 135 via the well region 130.

A plurality of the above-described structures is arranged in the depth direction (X direction) of the paper surface of FIG. 6. The string unit SU includes a set of a plurality of NAND strings NS arranged in the X direction.

(Planar Structure of Memory Cell Transistor MT)

Figure 7:
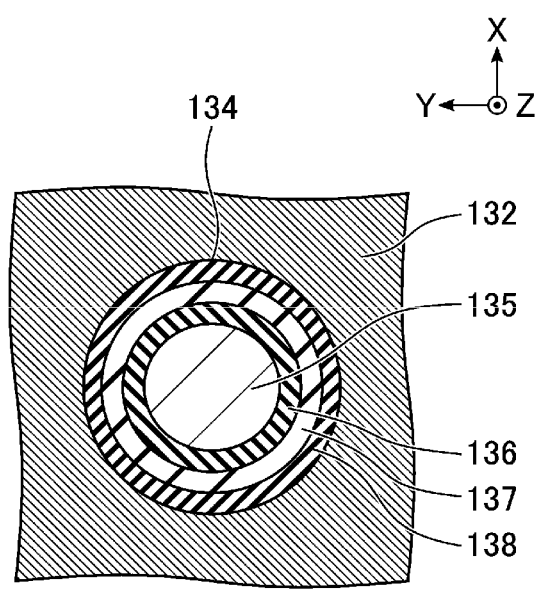
FIG. 7 is a cross-sectional view illustrating an example of a sectional structure of a memory pillar in the semiconductor storage device according to the first embodiment.

FIG. 7 illustrates a structure of the memory cell transistor MT in each block BLK as viewed from the Z direction. More specifically, an example of a sectional structure of the memory hole 134 and the wiring layer 132 (word line WL) in a plane including the X direction and the Y direction when viewed from the Z direction is illustrated.

In the illustrated cross-section, for example, the semiconductor layer 135 is provided in a central portion of the memory hole 134. The tunnel insulating film 136 surrounds the side surface of the semiconductor layer 135. The charge storage layer 137 surrounds the side surface of the tunnel insulating film 136. The block insulating film 138 surrounds the side surface of the charge storage layer 137. Further, the wiring layer 132 (word line WL) surrounds the block insulating film 138. That is, the wiring layer 132 (word line WL) surrounds the memory hole 134. As a result, the intersection of the memory hole 134 and the wiring layer 132 (word line WL) corresponds to a location of the memory cell transistor MT.

The memory hole 134 and the wiring layer 131 (select gate line SGS) also have the same sectional structure as the cross-section including the word line WL in a plane including the X direction and the Y direction. That is, the intersection of the memory hole 134 and the wiring layer 131 (select gate line SGS) corresponds to a location of the select transistor ST2.

The memory hole 134 and the wiring layer 133 (select gate line SGD) also have the same sectional structure as the cross-section including the word line WL in the plane including the X direction and the Y direction. That is, the intersection of the memory hole 134 and the wiring layer 133 (select gate line SGD) corresponds to a location of the select transistor ST1.

[1-1-4] Date Storage Method

In the semiconductor storage device 1 according to the first embodiment, a plurality of threshold voltage distributions is set according to the number of bits of data that may be stored in one memory cell transistor MT. In addition, the threshold voltage of each memory cell transistor MT may be set to be in any region of a plurality of threshold voltage distributions according to the type of data to be written. In the following, each of the plurality of threshold voltage distributions to which different data is assigned is referred to as a "state".

Figure 8:
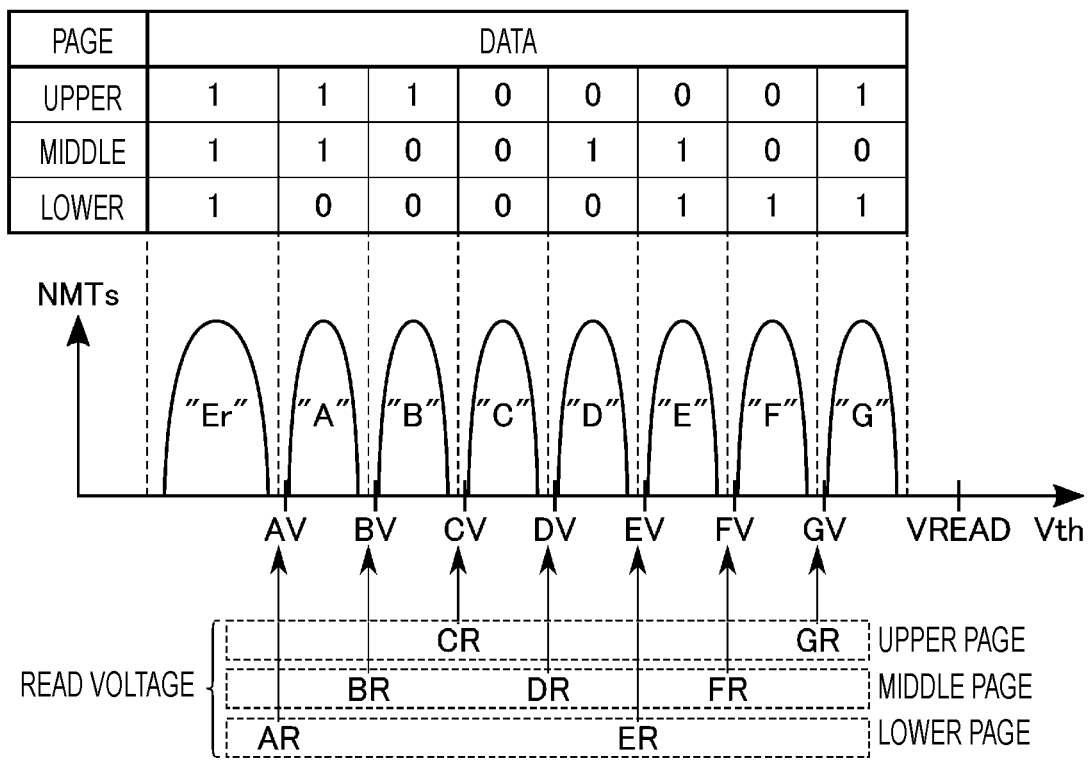
FIG. 8 is a schematic diagram illustrating an example of data allocation applied to memory cell transistors in the semiconductor storage device according to the first embodiment.

FIG. 8 illustrates an example of the threshold voltage distribution of a memory cell transistor MT, a read voltage, and a verify voltage in the semiconductor storage device 1 according to the first embodiment. In the threshold voltage distribution chart referred to below, NMTs on the vertical axis corresponds to the number of memory cell transistors MT, and Vth on the horizontal axis corresponds to the threshold voltage of the memory cell transistors MT.

As illustrated in FIG. 8, in the semiconductor storage device 1 according to the first embodiment, eight types of threshold voltage distributions are formed by, for example, a plurality of memory cell transistors MT. The eight types of threshold voltage distributions are called, for example, the "Er" state, the "A" state, the "B" state, the "C" state, the "D" state, the "E" state, the "F" state, and the "G" state in order from the lowest threshold voltage. The "Er" state corresponds to the erase state of the memory cell transistor MT. Each of the "A" state to the "G" state corresponds to a state in which data is written in the memory cell transistor MT.

In addition, different 3-bit data is assigned to each of the "Er" state to the "G" state, and only one bit is set to be different between two adjacent states. A method of storing 3-bit data in one memory cell transistor is called, for example, a triple-level cell (TLC) method. Below, an example of data allocation for eight types of threshold voltage distributions is listed.

"Er" state: "111 (higher bit/middle bit/lower bit)" data
"A" state: "110" data
"B" state: "100" data
"C" state: "000" data
"D" state: "010" data
"E" state: "011" data
"F" state: "001" data
"G" state: "101" data A verify voltage used in a write operation is set between adjacent states. Specifically, a verify voltage AV is set between the "Er" state and the "A" state. A verify voltage BV is set between the "A" state and the "B" state. A verify voltage CV is set between the "B" state and the "C" state. A verify voltage DV is set between the "C" state and the "D" state. A verify voltage EV is set between the "D" state and the "E" state. A verify voltage FV is set between the "E" state and the "F" state. A verify voltage GV is set between the "F" state and the "G" state. In the write operation, when the semiconductor storage device 1 detects that the threshold voltage of the memory cell transistor MT for storing certain data exceeds the verify voltage corresponding to the data, the programming of the memory cell transistor MT is completed.

The read voltage used in the read operation is also set between the adjacent states. Specifically, a read voltage AR is set between the "Er" state and the "A" state. A read voltage BR is set between the "A" state and the "B" state. A read voltage CR is set between the "B" state and the "C" state. A read voltage DR is set between the "C" state and the "D" state. A read voltage ER is set between the "D" state and the "E" state. A read voltage FR is set between the "E" state and the "F" state. A read voltage GR is set between the "F" state and the "G" state. Each of the read voltages is used to distinguish whether the threshold voltage of the memory cell transistor MT to be read is in the lower or upper state using the read voltage as a reference. Further, a read pass voltage VREAD is set to a voltage higher than the "G" state which is the state with the highest threshold voltage. The memory cell transistor MT having the gate to which the read pass voltage VREAD is applied is turned on regardless of the data to be stored. In the read operation, the semiconductor storage device 1 determines read data by determining the state in which the memory cell transistors MT are distributed using the read voltage.

For example, when the data allocation illustrated in FIG. 8 is applied, one page of read data composed of lower bits (lower page data) is determined based on a read result using the read voltage AR and a read result using the read voltage ER. One page of read data composed of medium bits (medium page data) is determined based on a read result using the read voltage BR, a read result using the read voltage DR, and a read result using the read voltage FR. One page of read data composed of higher bits (higher page data) is determined based on a read result using the read voltage CR and a read result using the read voltage GR. In the read operation, the logic circuit LC appropriately executes an arithmetic process using the plurality of read results and determines the read data.

In the meantime, the number of bits of data stored in one memory cell transistor MT described above is an example, and the number of bits is not limited thereto. For example, the memory cell transistor MT may store data of one bit, two bits, or four or more bits. In the semiconductor storage device 1, the number of threshold voltage distributions to be formed, the read voltage, the read pass voltage, and the verify voltage may be appropriately set according to the number of bits stored in the memory cell transistor MT.

In the present specification, the "read result" corresponds to the data sensed by the sense amplifier unit SAU when the control signal STB is asserted. The "read data" corresponds to the data output to the memory controller 2 by the semiconductor storage device 1 in the read operation. The operation for obtaining one or more of read results corresponding to one read voltage is called a "read process". The read process of the read voltages AR to GR is also called the read process of the "A" to states, respectively. The number of read results obtained in each read process corresponds to the number of times the control signal STB is asserted in the read process.

[1-2] Operation of Semiconductor Storage Device 1

Next, the operation of the semiconductor storage device according to the first embodiment will be described. In the following description, voltages applied to various wirings will be described only with reference numerals as appropriate. The memory cell transistor MT in the cell unit CU to be read is called a selected memory cell. In the read operation, the selected word line WL is called WLsel and the non-selected word line WL is called WLusel. The application of a voltage to the word line WL corresponds to the application of a voltage to the wiring by the driver module 14 via the signal line CG and the row decoder module 15. The nth (n is an integer of 0 or more) word line WL is called a word line WLn. The memory cell transistor MT connected to an (n+1)th word line WLn+1 is called an adjacent memory cell to the word line WLn.

[1-2-1] Write Operation

In the semiconductor storage device 1 according to the first embodiment, the write operation is executed on the memory cell transistors MT in each block BLK in the order illustrated in FIG. 9A. That is, according to the first embodiment, in a certain string unit SU, the data stored in the memory cell transistor MT connected to the word line WLn+1 is written after the data stored in the memory cell transistor MT connected to the word line WLn. That is, in a certain string unit SU, the write operation is performed layer by layer for each word line from the memory cell transistor MT connected to the word line WL0 that is closest to a source-side select gate line SGS, to the memory cell transistor MT connected to the word line WL7 that is closest to a drain-side select gate line SGD.

The order of performing the write operation is not limited thereto. For example, the write operation may be performed on the memory cell transistors MT in each block BLK of the semiconductor storage device 1 in the same order as illustrated in FIG. 9B. In this case, in a certain string unit SU, the data stored in the memory cell transistor MT connected to a word line WLn−1 is written after the data stored in the memory cell transistor MT connected to the word line WLn. That is, in a certain string unit SU, the write operation is performed layer by layer for each word line from the memory cell transistor MT connected to the word line WL7 that is closest to the drain-side select gate line SGD to the memory cell transistor MT connected to the word line WL0 that is closest to the source-side select gate line SGS.

Figure 10:
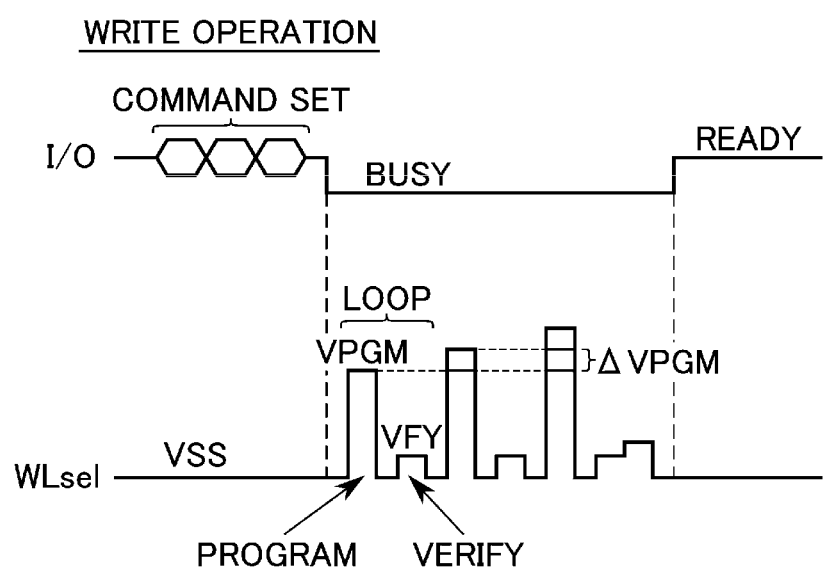
FIG. 10 is a timing chart illustrating an example of a write operation in the semiconductor storage device according to the first embodiment.

FIG. 10 illustrates an example of the state of the input/output signal I/O, and the voltage of the selected word line WLsel during the write operation of the semiconductor storage device 1, according to the first embodiment. The input/output signal I/O indicates a period during which the semiconductor storage device 1 is in a ready state and a command set (a command, an address, and data) is received from the external memory controller 2, and a period during which the semiconductor storage device 1 is in a busy state.

When a command set including a command instructing execution of a write operation, a memory cell address for storing data, and write data is input from the external memory controller 2 to the input/output signal I/O of the semiconductor storage device 1, the semiconductor storage device 1 transitions from the ready state to the busy state and executes the write operation.

In the write operation, the sequencer 13 first executes a program operation. Specifically, for example, the voltage VSS is applied to the sense amplifier module 16 and the bit line BL corresponding to the memory cell transistor MT to be written, and a voltage VINH is applied to the bit line corresponding to the write-inhibited memory cell transistor MT. The voltage VINH is higher than VSS, and the NAND string NS corresponding to the bit line BL to which the voltage VINH is applied is in a floating state, for example, because the select transistor ST1 is cut off. Then, the driver module 14 and the row decoder module 15 apply a program voltage VPGM to the selected word line WLsel. The program voltage VPGM is a high voltage capable of injecting electrons into the charge storage layer of the memory cell transistor MT.

Then, in the memory cell transistor MT to be written, electrons are injected into the charge storage layer due to a potential difference between a gate and a channel, and the threshold voltage rises. Meanwhile, in the write-inhibited memory cell transistor MT, the potential difference between the gate and the channel is reduced, for example, by boosting the channel of the NAND string NS in the floating state, and the rise of the threshold voltage is prevented.

Next, the sequencer 13 executes the verify operation. Specifically, the driver module 14 and the row decoder module 15 apply a verify voltage VFY to the selected word line WLsel. The verify voltage AV illustrated in FIG. 8 is used as the verify voltage VFY.

Then, the memory cell transistor MT connected to the selected word line WLsel is turned on or off depending on the threshold voltage thereof. In addition, each sense amplifier unit SAU determines whether the threshold voltage of the corresponding memory cell transistor MT is greater than a desired verify voltage, based on the voltage of the corresponding bit line BL.

Then, when the sequencer 13 detects that the threshold voltage of the corresponding memory cell transistor MT is greater than the desired verify voltage, the sequencer 13 determines that the verification of the memory cell transistor MT has passed, and inhibits the write of the memory cell transistor in the subsequent program operation.

Meanwhile, when the sequencer 13 detects that the threshold voltage of the corresponding memory cell transistor MT is equal to or lower than the desired verify voltage, the sequencer 13 determines that the verification of the memory cell transistor MT has failed, and sets the memory cell transistor MT as a write target in the subsequent program operation.

For example, the driver module 14 and the row decoder module 15 continuously apply a plurality of types of verify voltages to the selected word line WLsel in one verify operation, and the sequencer 13 may cause the sense amplifier module 16 to continuously execute a multiple-level verify. Further, the sequencer 13 may appropriately change the type and number of verify voltages applied in one verify operation according to the progress of the write operation. Meanwhile, the sequencer 13 may apply one type of verify voltage from the driver module 14 and the row decoder module 15 to the selected word line WLsel in one verify operation so as to cause the sense amplifier module 16 to execute a one-level verify.

One set of the program operation and the verify operation described above corresponds to one loop. The sequencer 13 repeatedly executes such a loop to step up the program voltage VPGM by AVPGM for each program loop. Then, when the sequencer 13 repeatedly executes the program loop a plurality of times (e.g., 19 times), the write operation is ended and the semiconductor storage device 1 is caused to transition from the busy state to the ready state.

Here, in the semiconductor storage device 1 according to the first embodiment, as illustrated in FIG. 6, in a certain string unit SU, a memory cell transistor MT connected to a certain word line WLn, a memory cell transistor MT connected to an adjacent word line WLn−1, and a memory cell transistor MT connected to an adjacent word line WLn+1 are in close proximity. Therefore, the threshold value of the memory cell transistor MT connected to a certain word line WLn may be influenced by the electrons stored in the charge storage layer of the memory cell transistor MT connected to the word lines WLn−1 and WLn+1 on both sides.

Here, when the write operation is performed in the order illustrated in FIG. 9A, the write operation is performed on the word line WLn after the write operation is performed on the word line WLn−1. That is, at the time when the write operation is performed on the memory cell transistor MT connected to the word line WLn, an amount of electrons stored in the charge storage layer of the memory cell transistor MT connected to the word line WLn−1 has already been confirmed. That is, after that, the amount of electrons stored in the charge storage layer of the memory cell transistor MT basically does not change. Therefore, the influence of the electrons stored in the charge storage layer of the memory cell transistor MT connected to the word line WLn−1 on the threshold voltage of the memory cell transistor MT connected to the word line WLn is taken into consideration in the verify operation, and the influence may be substantially eliminated.

Meanwhile, the write operation on the word line WLn+1 is executed after the write operation on the word line WLn. At the time when the write operation is performed on the memory cell transistor MT connected to the word line WLn (more specifically, when the verify operation is performed), the amount of electrons stored in the charge storage layer of the memory cell transistor MT connected to the word line WLn+1 has not been determined yet and is likely to change thereafter. More specifically, after the write operation is performed on the memory cell transistor MT connected to the word line WLn, the threshold voltage of the memory cell transistor MT connected to the word line WLn+1 may change significantly, e.g., from the "Er" state to the "G" state.

Therefore, the influence of the electrons stored in the charge storage layer of the memory cell transistor MT connected to the word line WLn+1 on the threshold voltage of the memory cell transistor MT connected to the word line WLn is difficult to eliminate in the process of writing operation.

When the write operations are performed in the order illustrated in FIG. 9B, a relationship between the word line WLn−1 and the word line WLn+1 is reversed. That is, the influence of the electrons stored in the charge storage layer of the memory cell transistor MT connected to the word line WLn+1 on the threshold voltage of the memory cell transistor MT connected to the word line WLn is taken into consideration during the verify operation, and the effect may be substantially eliminated. However, since the write operation on the word line WLn−1 is executed after that, it is difficult to eliminate the influence of the memory cell transistor MT connected to the word line WLn on the threshold voltage of the memory cell transistor MT when the write operation is executed.

[1-2-2] Read Operation

The semiconductor storage device 1 according to the first embodiment may execute at least two types of read operations. For example, the plurality of types of read operations that may be performed by the semiconductor storage device 1 include a normal read operation and a direct look ahead (DLA) read operation.

The normal read operation is a read operation in which the number of read times is one for each read voltage used. The DLA read operation is a read operation that determines the read result of the selected memory cell by using the read result of the adjacent memory cell with respect to the selected memory cell. That is, the DLA read operation includes the read operation of the adjacent memory cell and the read operation of the selected memory cell. Details of the DLA read operation will be described later.

Figure 11:
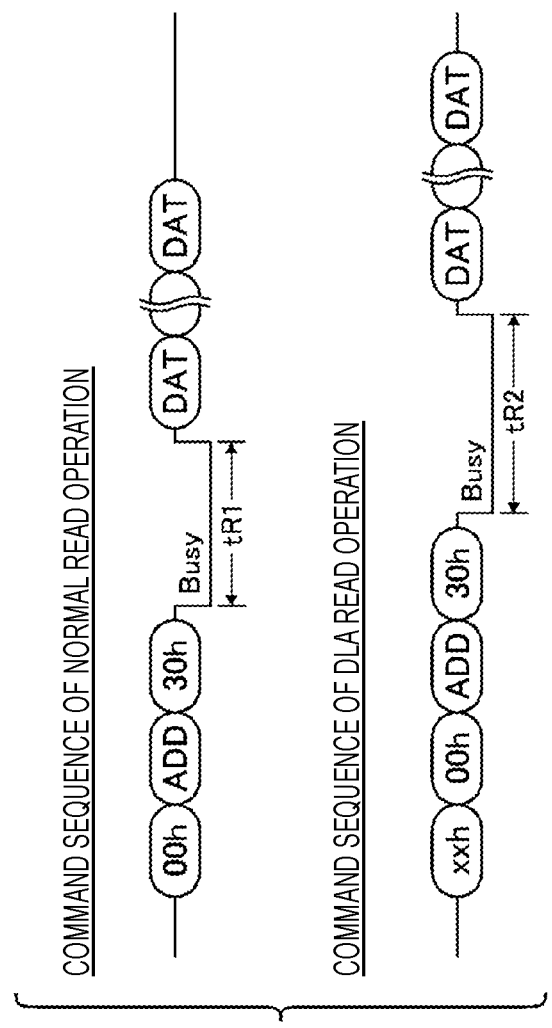
FIG. 11 is a conceptual diagram illustrating an example of a command sequence of a read operation in the semiconductor storage device according to the first embodiment.

FIG. 11 illustrates an example of a command sequence of a read operation in the semiconductor storage device 1 according to the first embodiment. The upper portion of FIG. 11 corresponds to the command sequence of a normal read operation. The lower portion of FIG. 11 corresponds to the command sequence of the DLA read operation.

As illustrated in the upper portion of FIG. 11, when causing the semiconductor storage device 1 to execute a normal read operation, the memory controller 2 transmits, for example, a command "00h", address information ADD, and a command "30h" to the semiconductor storage device 1 in this order. The command "00h" is a command that instructs the semiconductor storage device 1 to execute a read operation. The address information ADD includes an address corresponding to the cell unit CU to be read. The address information ADD may use a plurality of cycles of input/output signal I/O. The command "30h" is a command for instructing the semiconductor storage device 1 to start the read operation.

On the other hand, as illustrated in the lower portion of FIG. 11, when causing the semiconductor storage device 1 to execute a DLA read operation, the memory controller 2 transmits, for example, a command "xxh", the command "00h", the address information ADD, and the command "30h" to the semiconductor storage device 1 in this order. The command "xxh" is a prefix command that instructs the semiconductor storage device 1 to execute the DLA read operation. The presence or absence of the command "xxh" is different between the command sequence of the normal read operation and the command sequence of the DLA read operation.

The semiconductor storage device 1 transitions from the ready state to the busy state based on the reception of the command "30h". Then, the semiconductor storage device 1 executes the normal read operation, for example, when the command "xxh" is not received, and executes the DLA read operation when the command "xxh" is received. A time tR1 when the semiconductor storage device 1 executes the normal read operation is shorter than a time tR2 when the semiconductor storage device 1 executes the DLA read operation. The reason for this is that the DLA read operation includes a read operation for an adjacent memory cell and a read operation for a selected memory cell, as described later.

When the read operation is completed, the semiconductor storage device 1 transitions from the busy state to the ready state. Then, when the memory controller detects that the semiconductor storage device 1 transitions from the busy state to the ready state after instructing the semiconductor storage device 1 to execute the read operation, the memory controller 2 instructs the semiconductor storage device 1 to output the read data DAT. In addition, the semiconductor storage device 1 outputs the read data DAT to the memory controller 2 based on the instruction from the memory controller 2.

[1-2-3] Details of DLA Read Operation

Figure 12:
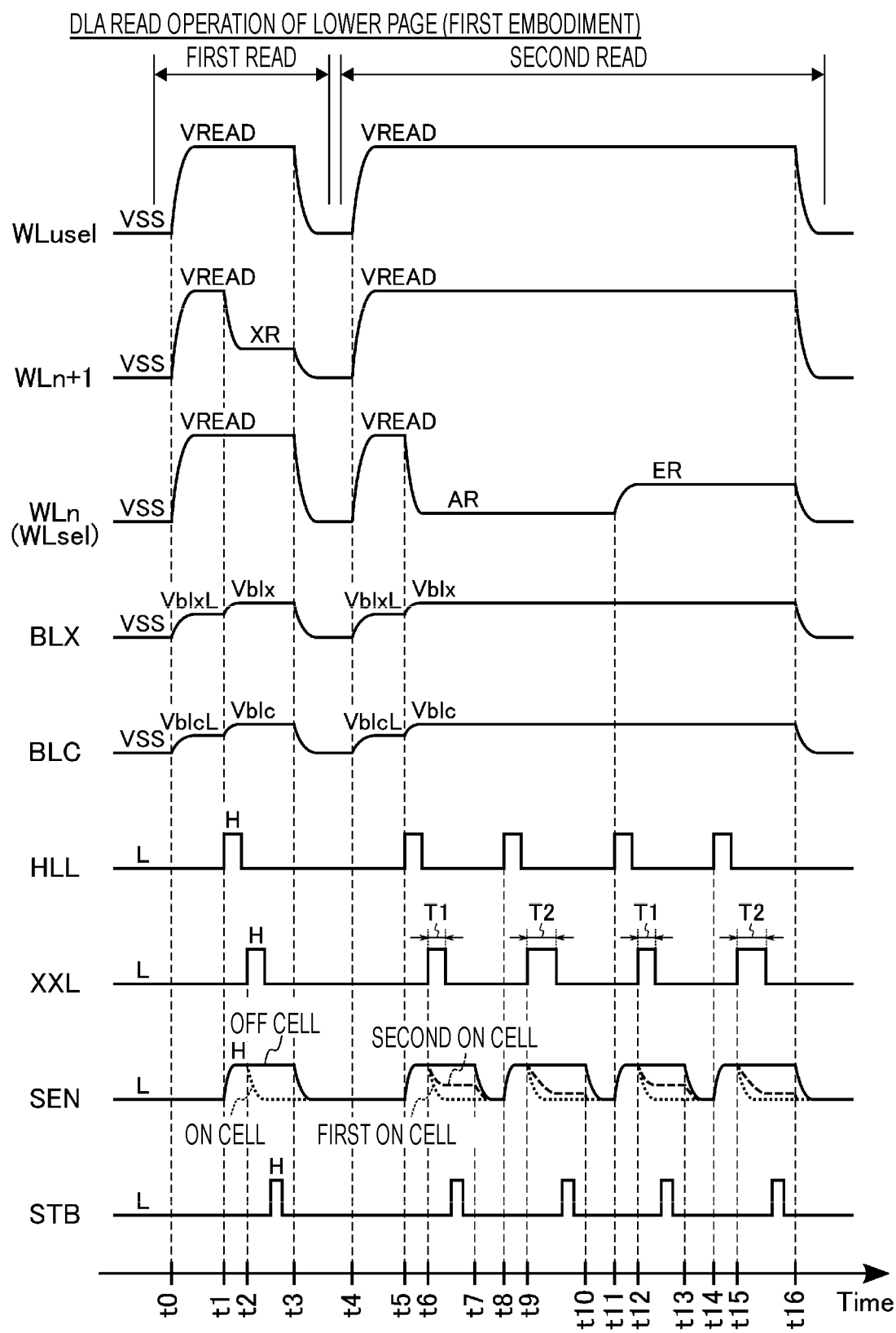
FIG. 12 is a timing chart illustrating an example of a DLA read operation in the semiconductor storage device according to the first embodiment.

Hereinafter, a specific example of the DLA read operation in the semiconductor storage device 1 according to the first embodiment will be described as a representative of reading the lower page data. FIG. 12 illustrates an example of a timing chart of a DLA read operation of lower page data in the semiconductor storage device 1, and the voltage of each of the word lines WLn, WLn+1, and WLusel, the control signals BLX, BLC, HLL, and XXL, and the node SEN according to the first embodiment. In this example, the word line WLn is set as the selected word line WLsel. That is, the memory cell transistor MT connected to the word line WLn is the selected memory cell, and the memory cell transistor MT connected to the word line WLn+1 is the adjacent memory cell.

As illustrated in FIG. 12, before the start of the DLA read operation, the voltage of each of the word lines WLn, WLn+1, and WLusel and the control signals BLX and BLC is, for example, the ground voltage VSS, and the voltage of each of the control signals HLL, XXL, and STB and the node SEN is, for example, at the "L" level. In the DLA read operation, for example, the sequencer 13 executes the first read in the times t0 to t4 and the second read in the times t4 to t16.

The first read is a read operation targeting an adjacent memory cell with respect to the selected memory cell that is a read target of the DLA read operation. In the first read in this example, the read operation using a read voltage XR is executed for the adjacent memory cell. For example, the read voltage DR is used as the read voltage XR. Other read voltages may be used as the read voltage XR, or voltages different from the read voltages AR to GR may be used.

The second read is a read operation targeting the selected memory cell. In the second read in this example, the read operation using the read voltages AR and ER is executed for the selected memory cell. Further, in the second read, the read process of each state includes two reads performed with different settings (data determination process, i.e., assertion of the control signal STB). Hereinafter, details of each of the first read and the second read will be described in order.

(First Read)

First, at time t0, the read pass voltage VREAD is applied to the word lines WLn, WLn+1, and WLusel. Further, at time t0, the sequencer 13 raises the voltage of the control signal BLX from VSS to VblxL and raises the voltage of the control signal BLC from VSS to VblcL. The voltage value of VblcL is lower than, for example, VblxL. Then, each of the transistor 21 to which VblxL is applied to the gate and the transistor 24 to which VblcL is applied to the gate is turned on.

As a result, the voltage of the bit line BL rises based on, for example, the voltage of the control signal BLC and the threshold voltage of the transistor 24. Then, when the voltage of each of the word lines WLn, WLn+1, and WLusel rises to VREAD, and the voltages of the control signals BLX and BLC rise to VblxL and VblcL, respectively, all the transistors in the NAND string NS are turned on. As a result, residual electrons in the channel of the NAND string NS in the selected string unit SU are removed.

Next, at time t1, the read voltage XR is applied to the word line WLn+1. Further, at time t1, the sequencer 13 raises the voltage of the control signal BLX from VblxL to Vblx and raises the voltage of the control signal BLC from VblcL to Vblc. The voltage value of Vblc is lower than, for example, Vblx. Then, the voltage of the bit line BL changes according to the state of the adjacent memory cell connected to the word line WLn+1. Specifically, when the adjacent memory cell is in the ON state, the voltage of the bit line BL connected to the adjacent memory cell drops. Meanwhile, when the adjacent memory cell is in the OFF state, the voltage of the bit line BL connected to the adjacent memory cell is maintained.

Further, at time t1, the sequencer 13 raises the voltage of the control signal HLL from the "L" level to the "H" level. Then, the transistor 22 having the "H" level voltage applied to its gate is turned on. As a result, the voltage of the node SEN rises from the "L" level to the "H" level. That is, the node SEN is charged via the transistor 22. Then, after the node SEN is charged, the sequencer 13 lowers the control signal HLL from the "H" level to the "L" level and turns off the transistor 22.

Next, at time t2, the sequencer 13 raises the voltage of the control signal XXL from the "L" level to the "H" level. Then, the transistor 23 having the "H" level voltage applied to its gate is turned on. This forms a current path between the node SEN and the bit line BL, and the voltage of the node SEN changes according to the voltage of the bit line BL connected to the NAND string NS. Specifically, when the adjacent memory cell connected to the word line WLn+1 is in the ON state, the voltage of the node SEN corresponding to the adjacent memory cell drops (see the ON cell in, e.g., FIG. 12). Meanwhile, when the adjacent memory cell is in the OFF state, the voltage of the node SEN corresponding to the adjacent memory cell is maintained at the "H" level (see the OFF cell in, e.g., FIG. 12).

Then, after the voltage based on the voltage of the bit line BL is reflected on the node SEN after a predetermined time has elapsed, the sequencer 13 lowers the voltage of the control signal XXL from the "H" level to the "L" level. Then, the transistor 23 is turned off and the voltage of the node SEN is fixed. Hereinafter, the time during which the voltage of the control signal XXL maintains the "H" level is also referred to as the discharge time of the node SEN.

Thereafter, the sequencer 13 asserts the control signal STB to determine the threshold voltage of the adjacent memory cell connected to the word line WLn+1. Specifically, the sense amplifier unit SAU determines whether the threshold voltage of the adjacent memory cell is equal to or higher than the read voltage XR and stores the determination result in, for example, the latch circuit ADL. In the following description, the read result obtained by the first read is also referred to as DLA data.

Next, at time t3, the sequencer 13 returns the voltages of the word lines WLn, WLn+1, and WLusel, the control signals BLX, BLC, HLL, XXL, and STB, and the node SEN to the states before the start of the first read. As a result, the sequencer 13 completes the first read and shifts to the second read.

(Second Read)

First, at time t4, as at time t0, the read pass voltage VREAD is applied to the word lines WLn, WLn+1, and WLusel, and the sequencer 13 raises the voltages of the control signals BLX and BLC to VblxL and VblcL, respectively. As a result, as at time t0, residual electrons in the channel of the NAND string NS in the selected string unit SU are removed.

Next, from time t5 to t10, the sequencer 13 executes the read process of the read voltage AR. Specifically, at time t5, the read voltage AR is applied to the word line WLn, and the sequencer 13 raises the voltages of the control signals BLX and BLC to Vblx and Vblc, respectively, as at time t1. Then, the voltage of the bit line BL changes according to the state of the selected memory cell connected to the word line WLn. Specifically, when the selected memory cell is in the ON state, the voltage of the bit line BL connected to the selected memory cell drops. Meanwhile, when the selected memory cell is in the OFF state, the voltage of the bit line BL connected to the selected memory cell is maintained.

In addition, at time t5, the sequencer 13 raises the voltage of the control signal HLL to the "H" level and turns on the transistor 22 as at time t1. As a result, the node SEN is charged via the transistor 22. Then, after the node SEN is charged, the sequencer 13 lowers the control signal HLL to the "L" level and turns off the transistor 22.

Next, at time t6, the sequencer 13 raises the voltage of the control signal XXL to the "H" level and turns on the transistor 23, as at time t2. This forms a current path between the node SEN and the bit line BL, and the voltage of the node SEN changes according to the voltage of the bit line BL connected to the NAND string NS. Specifically, when the selected memory cell is in the ON state, the voltage of the node SEN corresponding to the selected memory cell drops. Meanwhile, when the selected memory cell is in the OFF state, the voltage of the node SEN corresponding to the selected memory cell is maintained at the "H" level. Then, after the time T1 has elapsed, the sequencer 13 lowers the voltage of the control signal XXL from the "H" level to the "L" level. Then, the transistor 23 is turned off and the voltage of the node SEN is fixed.

In the meantime, in FIG. 12, the two types of memory cell transistors MT that are preferably turned on by the read voltage of each state are indicated as a first ON cell and a second ON cell, respectively. The first ON cell corresponds to the ON cell when the threshold voltage of the adjacent memory cell is low. The second ON cell corresponds to the ON cell when the threshold voltage of the adjacent memory cell is high. For example, in the process at time t6, the voltage drop amount of the node SEN corresponding to the second ON cell is smaller than the voltage drop amount of the node SEN corresponding to the first ON cell. In this example, it is assumed that the voltage of the node SEN connected to the first ON cell is fixed to be lower than the threshold voltage of the transistor 26 and the voltage of the node SEN connected to the second ON cell is fixed to be higher than the threshold voltage of the transistor 26 by the process at the time t6.

Thereafter, the sequencer 13 asserts the control signal STB to determine the threshold voltage of the selected memory cell connected to the word line WLn+1. Specifically, the sense amplifier unit SAU determines whether the threshold voltage of the selected memory cell is equal to or higher than the read voltage AR, and stores the determination result in, for example, the latch circuit BDL. Then, the sequencer 13 resets the voltage of the node SEN to the "L" level.

Next, from time t8 to t10, the sequencer 13 executes a process similar to that from time t5 to t7. The discharge time of the node SEN is different between the process from time t5 to t7 and the process from time t8 to t10. Specifically, the discharge time "T2" of the node SEN in the process at time t9 is set to be longer than the discharge time "T1" of the node SEN in the process at time t6. In this example, it is assumed that the voltage of the node SEN connected to the first ON cell and the voltage of the node SEN connected to the second ON cell are fixed to be lower than the threshold voltage of the transistor 26 by the process at time t9. Further, the sequencer 13 stores the determination result using the read voltage AR in the process at time t9 in, for example, the latch circuit CDL. Then, the sequencer 13 resets the voltage of the node SEN to the "L" level. Other processes from time t8 to t10 are similar to, for example, the processes from time t5 to t7.

Next, from time t11 to time t16, the sequencer 13 executes the read process of the read voltage ER. The voltage applied to the word line WLn is different between the process from time t11 to t16 and the process from time t5 to t10. Specifically, at time t11, the read voltage ER is applied to the word line WLn. The sequencer 13 stores the determination result using the read voltage ER in the process at time t12 in, for example, the latch circuit DDL. Further, the sequencer 13 stores the determination result using the read voltage ER in the process at time t15 in, for example, the latch circuit EDL.

Then, at time t16, the sequencer 13 returns the voltages of the word lines WLn, WLn+1, and WLusel, the control signals BLX, BLC, HLL, XXL, and STB, and the node SEN to the states before the start of the second read. The other processes from time t11 to t16 are similar to, for example, the processes from time t5 to t10. As a result, the sequencer 13 completes the second read.

As described above, when the first read and the second read in the DLA read operation are completed, the sequencer 13 executes the arithmetic process of the data stored in the latch circuits BDL, CDL, DDL, and EDL based on, for example, the DLA data stored in the latch circuit ADL. Hereinafter, the read result when the discharge time of the node SEN is "T1" is referred to as first data, and the read result when the discharge time of the node SEN is "T2" is referred to as second data. That is, in this example, the latch circuits BDL and CDL store the first and second data corresponding to the read voltage AR, respectively. The latch circuits DDL and EDL store the first and second data corresponding to the read voltage ER, respectively.

For example, when the DLA data stored in the latch circuit ADL is "1", the sequencer 13 uses the first data of the read voltage AR stored in the latch circuit BDL and the first data of the read voltage ER stored in the latch circuit DDL to determine the read data of the lower page. Then, the sequencer 13 stores the determined read data of the lower page in the latch circuit XDL.

In the meantime, when the DLA data stored in the latch circuit ADL is "0", the sequencer 13 determines the read data of the lower page by using the second data of the read voltage AR stored in the latch circuit CDL and the second data of the read voltage ER stored in the latch circuit EDL. Then, the sequencer 13 stores the determined read data of the lower page in the latch circuit XDL.

When the determined read data is stored in the latch circuit XDL, the sequencer 13 completes the DLA read operation and shifts the semiconductor storage device 1 from the busy state to the ready state. Thereafter, the sequencer 13 outputs the read data stored in the latch circuit XDL to the memory controller 2 based on the instruction of the memory controller 2.

As described above, the semiconductor storage device 1 according to the first embodiment may execute the DLA read operation of lower page data. The semiconductor storage device 1 according to the first embodiment may appropriately execute the DLA read operation in the middle page and upper page read operations, similarly to the lower page read operation. Meanwhile, the semiconductor storage device 1 may execute the DLA read operation even when the data stored in one memory cell transistor MT is other than 3 bits.

[1-3] Effect of First Embodiment

According to the semiconductor storage device 1 according to the first embodiment described above, the occurrence of read errors may be prevented. Details of the effects of the semiconductor storage device 1 according to the first embodiment will be described below.

In the semiconductor storage device, the threshold voltages of the plurality of memory cells after the write operation have variations close to a normal distribution. In addition, the threshold voltage of a memory cell may change due to coupling between adjacent word lines WL when writing to an adjacent memory cell is performed after writing data to the memory cell.

Here, an example of a change in the threshold voltage distribution of the memory cell transistor MT based on the threshold voltage of the adjacent memory cell will be described with reference to FIG. 13. The upper portion of FIG. 13 corresponds to a threshold voltage distribution formed by a plurality of memory cell transistors MT which is connected to the word line WLn and whose adjacent memory cells have the threshold voltage in the "Er" state. The lower portion of FIG. 13 corresponds to a threshold voltage distribution formed by a plurality of memory cell transistors MT which is connected to the word line WLn and whose adjacent memory cells have the threshold voltage in the "G" state.

As illustrated in the upper portion of FIG. 13, when the threshold voltage of the adjacent memory cell is in the "Er" state, the change in the threshold voltage distribution of the memory cell transistor MT of the word line WLn after writing is prevented. Meanwhile, as illustrated in the lower portion of FIG. 13, when the threshold voltage of the adjacent memory cell is in the "G" state, the threshold voltage of the memory cell transistor MT of the word line WLn after the write operation shifts to the plus side. For example, the shift amount of the threshold voltage due to the influence of the adjacent memory cell increases as the threshold voltage of the adjacent memory cell increases.

The threshold voltage distribution of the memory cells may be widened by the change in the threshold voltage of the memory cells according to the data stored in the adjacent memory cells described above. Then, the spread of the threshold voltage distribution may cause a decrease in reliability, writing performance, and reading performance of the semiconductor storage device. Therefore, it is preferable to prevent the spread of the threshold voltage distribution. As a method of reducing the influence of the threshold voltage of the adjacent memory cell, it is considered to execute the DLA read operation.

In the DLA read operation of comparative example, when a specific state written in the memory cell connected to the word line WLn is read, the word line WLn+1 is read at least once. The reading of the word line WLn+1 is executed to check whether the threshold voltage of the adjacent memory cell is high or low. Then, in the reading of the word line WLn, the read using the different read pass voltage is executed at least twice for each state.

Figure 14:
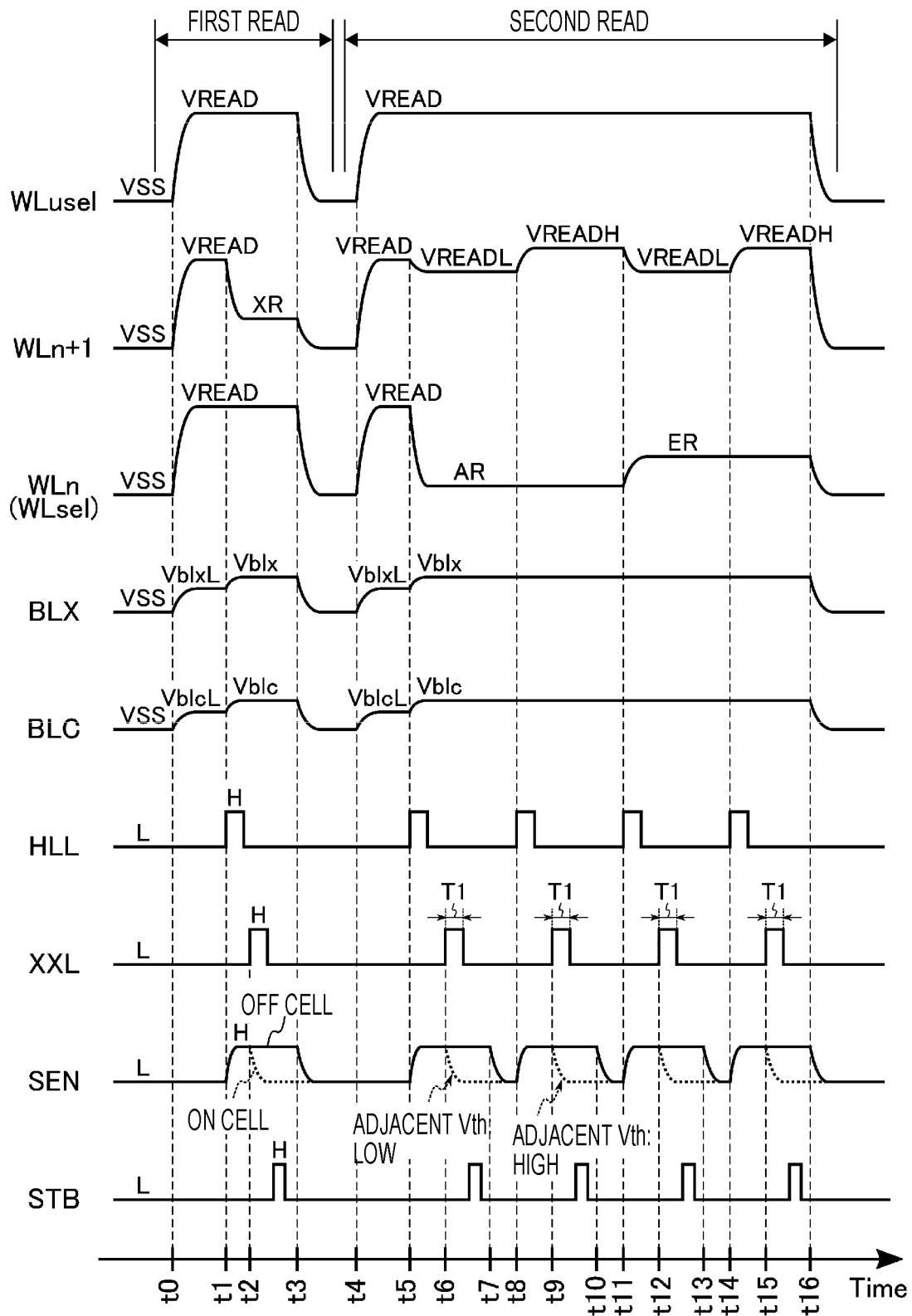
FIG. 14 is a timing chart illustrating an example of a DLA read operation in a semiconductor storage device according to a comparative example.

FIG. 14 illustrates an example of a timing chart of the DLA read operation of lower page data in the semiconductor storage device 1 according to the comparative example. As illustrated in FIG. 14, the DLA read operation of the comparative example is different from the first embodiment in that the discharge time of the node SEN at the time of the second read is fixed and the voltage applied to the word line WLn+1 connected to the adjacent memory cell is varied.

Briefly, in the second read of the DLA read operation in the comparative example, the sequencer 13 applies a read pass voltage VREADL to the word line WLn+1 when reading the first data. Meanwhile, the sequencer 13 applies a read pass voltage VREADH to the word line WLn+1 when reading the second data. VREADH is a voltage higher than VREADL. Each of VREADL and VREADH may have the same voltage as VREAD or may have a different voltage.

When the first read detects that the threshold voltage of the adjacent memory cell is low, it is estimated that the shift amount of the threshold voltage of the selected memory cell is small. Meanwhile, when the first read detects that the threshold voltage of the adjacent memory cell is high, it is estimated that the shift amount of the threshold voltage of the selected memory cell is large. Therefore, the sequencer 13 in the comparative example corrects the effective threshold voltage of the selected memory cell by applying VREADL or VREADH to the word line WLn+1. For example, as the read pass voltage applied to the word line WLn+1 becomes higher, the effective threshold voltage of the selected memory cell may be decreased.

As a result, the semiconductor storage device 1 according to the comparative example may selectively use the first data and the second data in which the influence of the adjacent memory cell is prevented, and prevent the occurrence of read errors. Meanwhile, in the DLA read operation like the comparative example, the number of transitions of the voltage of the word line WL in the second read increases. For example, in the semiconductor storage device 1 in which memory cells are three-dimensionally stacked, the word line WL has a large parasitic resistance and parasitic capacitance. Therefore, in the DLA read operation of the comparative example, the read time may be prolonged due to an increase in the number of transitions of the voltage of the word line WL.

Therefore, the semiconductor storage device 1 according to the first embodiment, in carrying out the DLA read operation, executes the read a plurality of times for each state while the voltage of the word line WLn+1 is fixed. Then, the semiconductor storage device 1 according to the first embodiment changes the discharge time of the node SEN in a plurality of reads for each state. Prolonging the discharge time of the node SEN corresponds to increasing the voltage of the word line WLn+1 in the comparative example.

For example, when the discharge time of the node SEN is short (e.g., the discharge time of "T1"), it is possible to sense a selected memory cell having a relatively low threshold voltage, that is, a selected memory cell connected to the node SEN that discharges quickly. Meanwhile, when the discharge time of the node SEN is long (e.g., the discharge time of "T2"), it is possible to sense a selected memory cell having a relatively high threshold voltage, that is, a selected memory cell connected to the node SEN that discharges slowly.

As a result, similarly to the comparative example, the semiconductor storage device 1 according to the first embodiment may selectively use the read result of the second read (first data or second data), which is used to calculate the read data, based on the result of the first read. Therefore, the semiconductor storage device 1 according to the first embodiment may prevent the occurrence of read errors and improve the reliability of the semiconductor storage device 1.

Further, the semiconductor storage device 1 according to the first embodiment corrects the threshold voltage of the selected memory cell by controlling the discharge time of the node SEN, that is, by controlling the control signal XXL. In general, a time required for the control signal XXL to propagate to the respective sense amplifiers SA in the sense amplifier unit 16 is shorter than a time required for a voltage in the word line WL is settled at the target level. In view of this, it is easier to design a signal propagation delay of the control signal XXL than to vary the voltage applied to the word line WL. Therefore, the voltage of the control signal XXL may shift faster than the voltage of the word line WL. Therefore, the semiconductor storage device 1 according to the first embodiment may execute a faster DLA read operation than the comparative example while preventing the spread of the threshold voltage distribution due to the coupling between the adjacent word lines.

In the above description, as illustrated in FIG. 9A, it is assumed that a write operation is sequentially executed layer by layer from the word line WL0 that is closest to the source-side select gate line SGS to the word line WL7 that is closest to the drain-side select gate line SGD. However, as illustrated in FIG. 9B, when the write operation is sequentially executed layer by layer from the word line WL7 that is closest to the drain-side select gate line SGD to the word line WL0 that is closest to the source-side select gate line SGS, the same voltage is applied to the word line WLn−1 instead of the word line WLn+1. In that case, the same voltage as that of the non-selected word line WLusel is applied to the word line WLn+1. In this way, the present embodiment may be applied by appropriately changing the word line of interest in addition to the selected word line WLsel even when the order in which the write operation is executed is changed.

[1-4] Modifications of First Embodiment

The DLA read operation in the semiconductor storage device 1 according to the first embodiment described above may be modified in various ways. Hereinafter, specific examples of the DLA read operation of each of the first modification, a second modification, and a third modification of the first embodiment will be described in order and the case of reading the lower page data is shown as a representative example as in the first embodiment.

First Modification of First Embodiment

Figure 15:
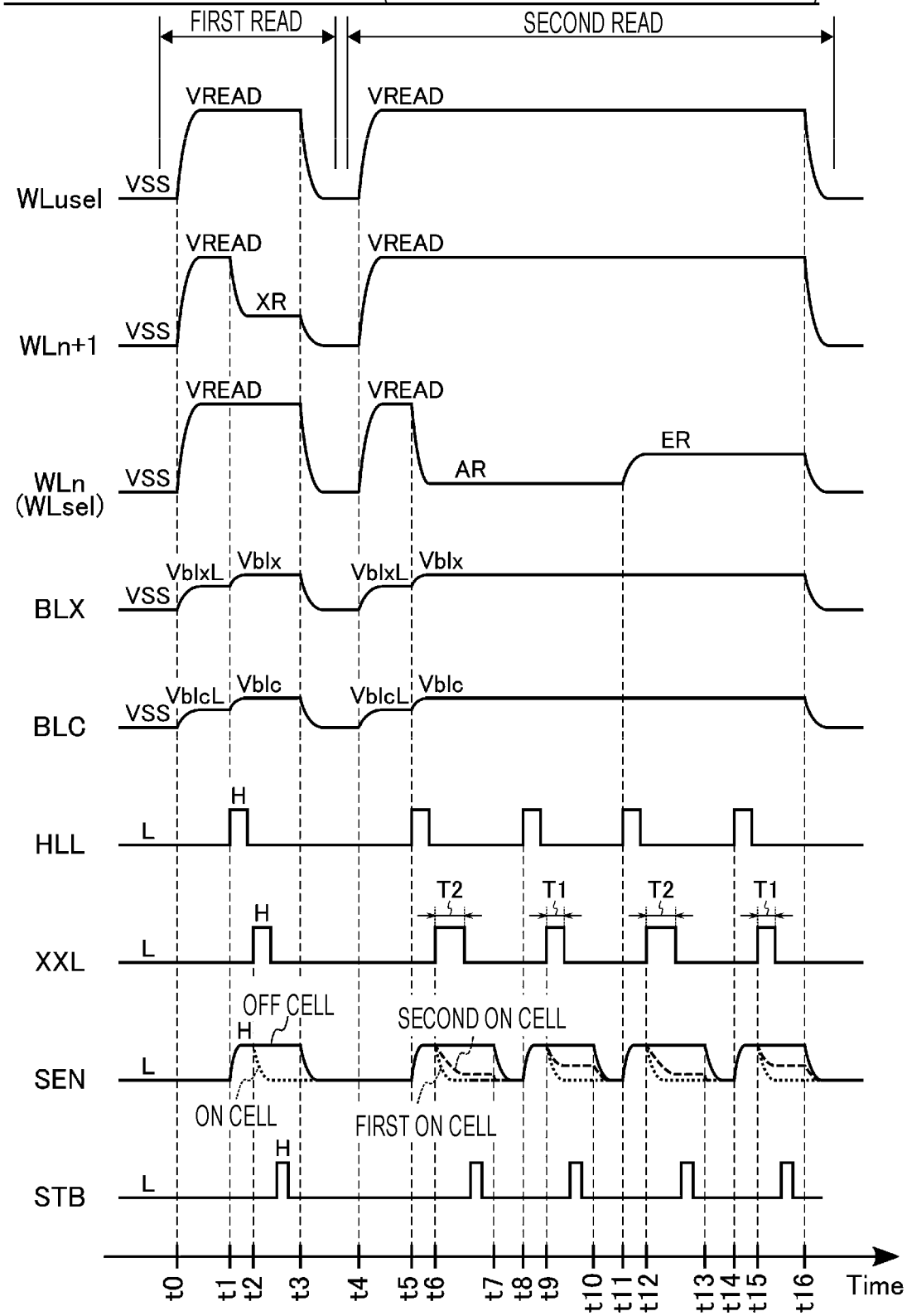
FIG. 15 is a timing chart illustrating an example of a DLA read operation in a semiconductor storage device according to a first modification of the first embodiment.

FIG. 15 illustrates an example of a timing chart of the DLA read operation in the semiconductor storage device according to the first modification of the first embodiment. As illustrated in FIG. 15, the DLA read operation in the first modification of the first embodiment differs from the DLA read operation in the first embodiment in the setting of the discharge time of the node SEN in the second read.

Specifically, in the first modification of the first embodiment, the setting of the time period during which the control signal XXL is maintained at the "H" level in the second read is switched between the time periods T1 and T2. That is, the sequencer 13 in the first modification of the first embodiment executes a data determination process in the order of the second data and the first data in the read process of each state in the second read. Other operations in the first modification of the first embodiment are similar to those of the first embodiment.

Even in such a case, the semiconductor storage device according to the first modification of the first embodiment may selectively use the read result of the second read used in the calculation of the read data based on the result of the first read, as in the first embodiment. Therefore, the semiconductor storage device 1 according to the first modification of the first embodiment may prevent the occurrence of read errors and improve the reliability of the semiconductor storage device 1 as in the first embodiment.

Second Modification of First Embodiment

Figure 16:
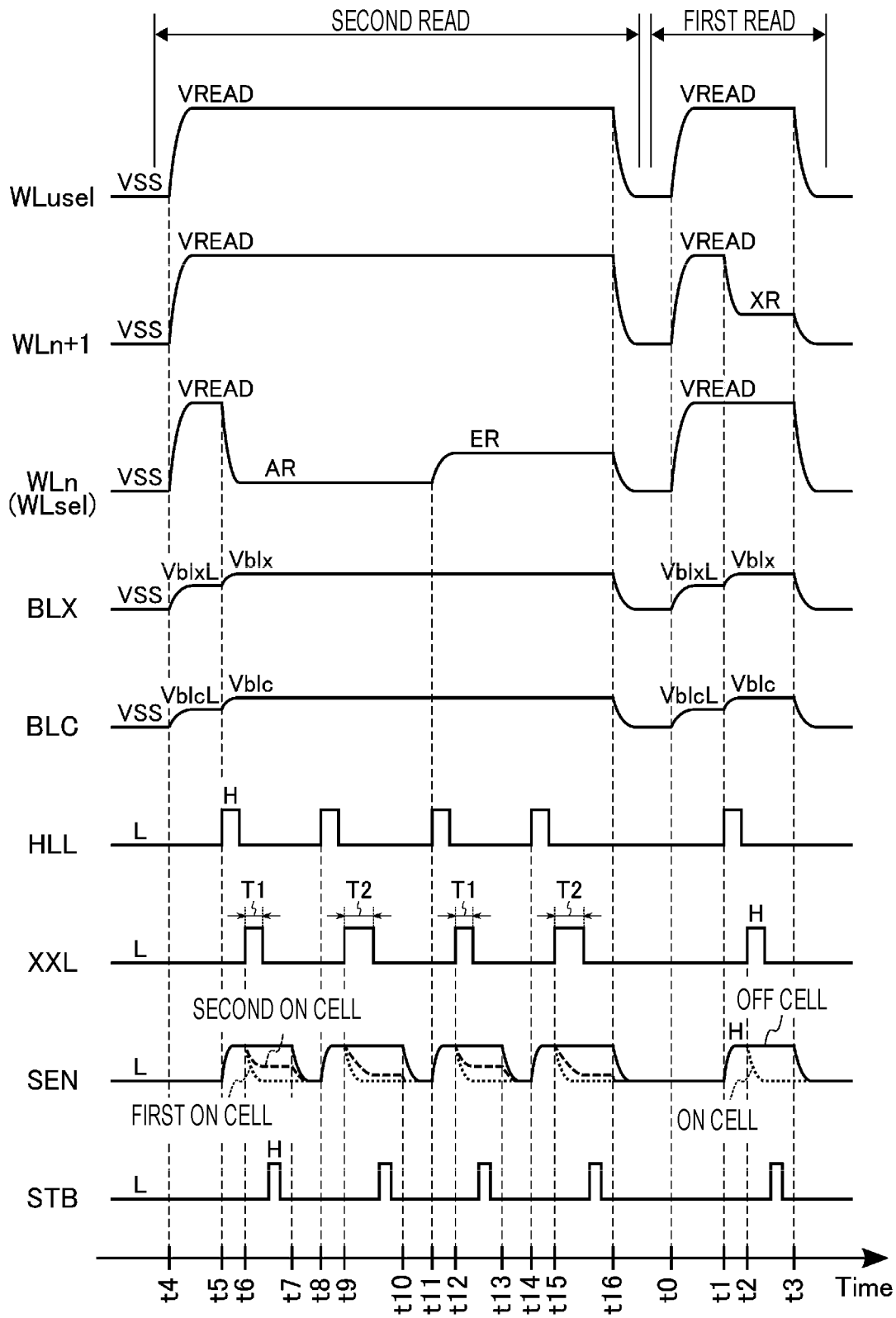
FIG. 16 is a timing chart illustrating an example of a DLA read operation in a semiconductor storage device according to a second modification of the first embodiment.

FIG. 16 illustrates an example of a timing chart of the DLA read operation in the semiconductor storage device according to the second modification of the first embodiment. As illustrated in FIG. 16, in the DLA read operation according to the second modification of the first embodiment, the order in which the first read and the second read are executed is exchanged with respect to the DLA read operation in the first embodiment.

Specifically, the sequencer 13 in the second modification of the first embodiment performs the processes from times t0 to t3 after performing the processes from times t4 to t16 in the first embodiment. That is, the sequencer 13 acquires the first data and the second data of each state by the second read, and then acquires the DLA data by the first read. Other operations in the second modification of the first embodiment are similar to those of the first embodiment.

Even in such a case, the semiconductor storage device according to the second modification of the first embodiment may selectively use the read result of the second read used in the calculation of the read data based on the result of the first read, as in the first embodiment. Therefore, the semiconductor storage device 1 according to the second modification of the first embodiment may prevent the occurrence of read errors and improve the reliability of the semiconductor storage device 1 as in the first embodiment.

Third Modification of First Embodiment

Figure 17:
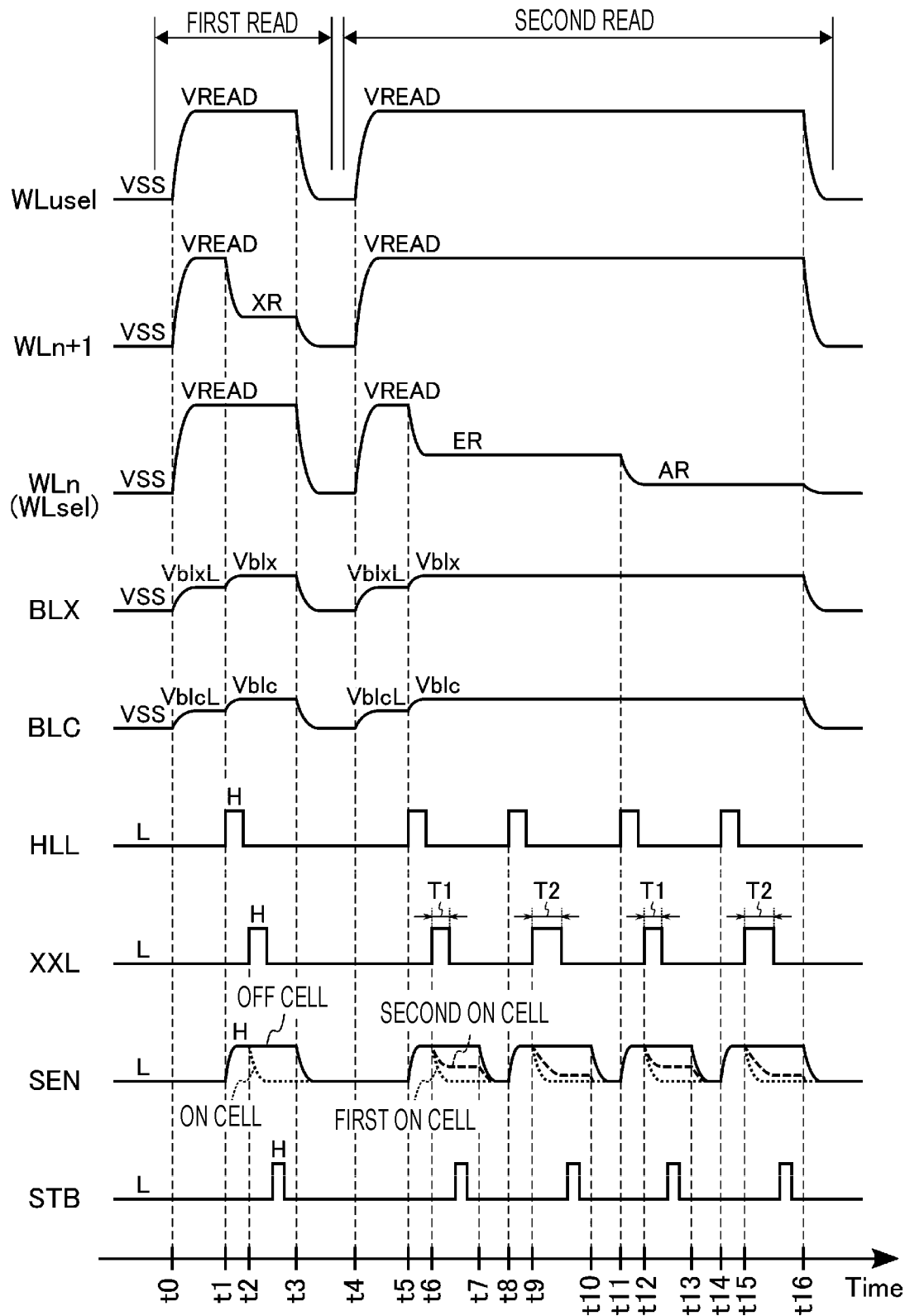
FIG. 17 is a timing chart illustrating an example of a DLA read operation in a semiconductor storage device according to a third modification of the first embodiment.

FIG. 17 illustrates an example of a timing chart of the DLA read operation in the semiconductor storage device according to the third modification of the first embodiment. As illustrated in FIG. 17, in the DLA read operation according to the third modification of the first embodiment, the order of the read voltages applied in the second read is exchanged with respect to the DLA read operation in the first embodiment.

Specifically, the sequencer 13 in the third modification of the first embodiment executes the read process from the higher voltage side. That is, for example, when reading the lower page data, the sequencer 13 executes the read process in the second read in the order of the read voltages ER and AR. Other operations in the third modification of the first embodiment are similar to those of the first embodiment.

Even in such a case, the semiconductor storage device according to the third modification of the first embodiment may selectively use the read result of the second read used in the calculation of the read data based on the result of the first read, as in the first embodiment. Therefore, the semiconductor storage device 1 according to the third modification of the first embodiment may prevent the occurrence of read errors and improve the reliability of the semiconductor storage device 1 as in the first embodiment.

[2] Second Embodiment

The semiconductor storage device 1 according to the second embodiment has the same configuration as the semiconductor storage device 1 according to the first embodiment. The semiconductor storage device 1 according to the second embodiment executes the DLA read operation in which the first embodiment and the comparative example are combined. The semiconductor storage device 1 according to the second embodiment will be described below regarding the differences from the first embodiment.

[2-1] DLA Read Operation

Figure 18:
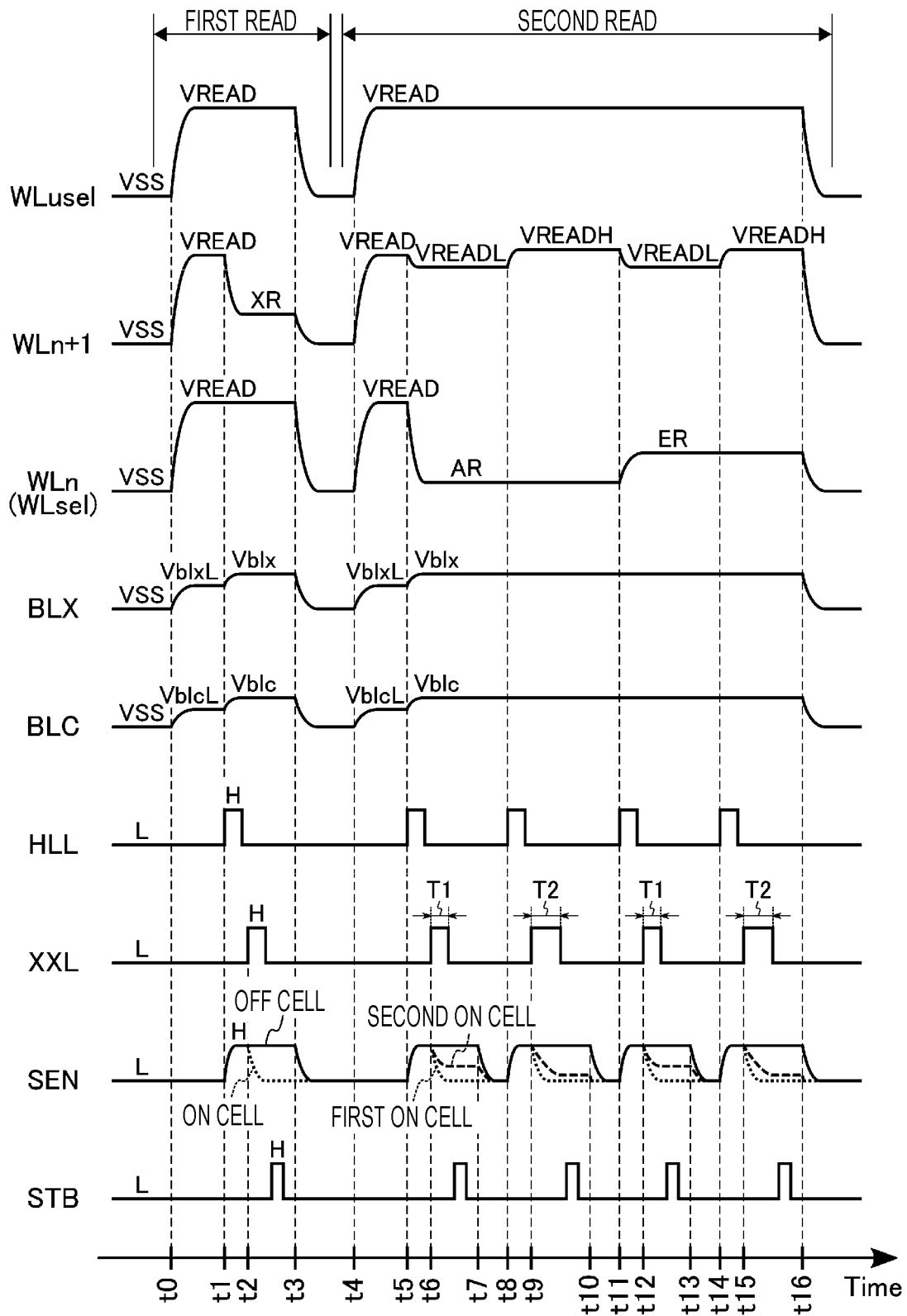
FIG. 18 is a timing chart illustrating an example of a DLA read operation in a semiconductor storage device according to a second embodiment.

Hereinafter, a specific example of the DLA read operation in the semiconductor storage device 1 according to the second embodiment will be described as a representative of reading the lower page data. FIG. 18 illustrates an example of a timing chart of the DLA read operation of lower page data in the semiconductor storage device 1 according to the second embodiment. As illustrated in FIG. 18, the DLA read operation in the second embodiment has a configuration in which the operation of the word line WLn+1 in the comparative example and the operation other than the word line WLn+1 in the first embodiment are combined.

Specifically, in the DLA read operation according to the second embodiment, the sequencer 13 sets the charging time of the node SEN to "T1" and applies the read pass voltage VREADL to the word line WLn+1 connected to the adjacent memory cell during the read process corresponding to the first data determination process. Similarly, during the read process corresponding to the second data determination process, the sequencer 13 sets the charging time of the node SEN to "T2" and applies the read pass voltage VREADH to the word line WLn+1 connected to the adjacent memory cell. The other operations of the DLA read operation in the second embodiment are the same as those in the first embodiment.

[2-2] Effect of Second Embodiment

As described above, the semiconductor storage device 1 according to the second embodiment executes the DLA read operation in which the first embodiment and the comparative example are combined. The second read in the first embodiment briefly maintains the voltage of the word line WLn+1 connected to the adjacent memory cell at VREAD. Then, in the second read of the second embodiment, the voltage of the word line WLn+1 is appropriately changed to VREADL or VREADH. Accordingly, in the second read of the second embodiment, the voltage of the word line WLn+1 is shifted and the discharge time of the node SEN is also changed.

As a result, in the semiconductor storage device 1 according to the second embodiment, a correction range of the threshold voltage of the selected memory cell in the DLA read operation may be wider than that in the first embodiment. As a result, the semiconductor storage device according to the second embodiment may prevent the occurrence of read errors and improve the reliability of the semiconductor storage device 1 than that of the first embodiment.

In the semiconductor storage device 1 according to the second embodiment, the read pass voltage of the word line WLn+1 changes during the second read of the DLA read operation, which may reduce the read speed. However, in the semiconductor storage device 1 according to the second embodiment, the amplitude of the word line WLn+1 may be set to be smaller than that of the comparative example in combination with the correction of the threshold voltage by the control signal XXL. Therefore, the semiconductor storage device 1 according to the second embodiment may speed up the DLA read operation as compared with the comparative example.

[2-3] Modifications of Second Embodiment

The DLA read operation in the semiconductor storage device 1 according to the second embodiment described above may be modified in various ways. Hereinafter, a specific example of the DLA read operation of each of the first modification and the second modification of the second embodiment will be described in order and the case of reading the lower page data is shown as a representative example as in the second embodiment.

First Modification of Second Embodiment

Figure 19:
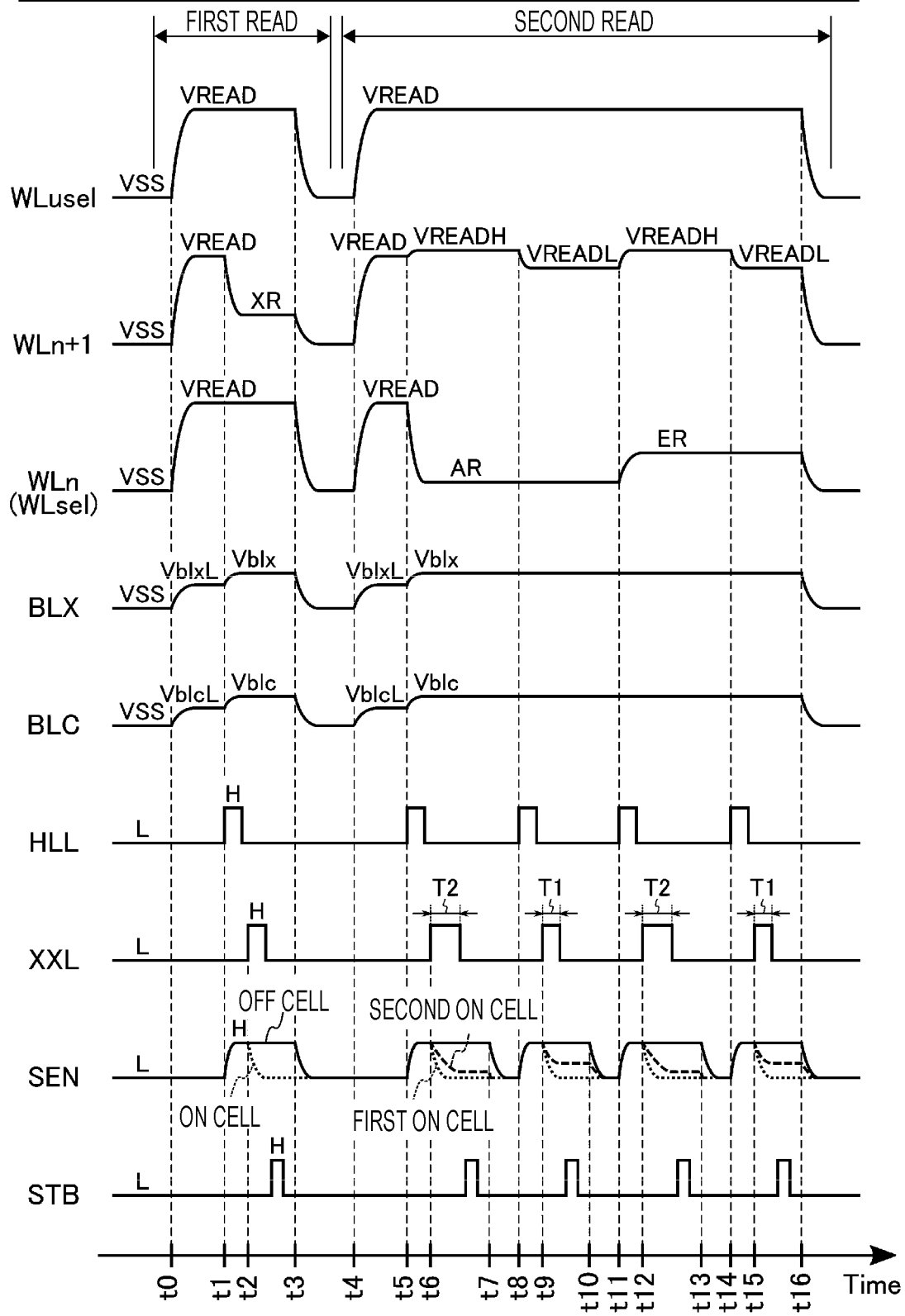
FIG. 19 is a timing chart illustrating an example of a DLA read operation in a semiconductor storage device according to a first modification of the second embodiment.

FIG. 19 illustrates an example of a timing chart of the DLA read operation in the semiconductor storage device according to the first modification of the second embodiment. As illustrated in FIG. 19, the DLA read operation in the first modification of the second embodiment differs from the DLA read operation in the second embodiment in the setting of the discharge time of the node SEN in the second read.

Specifically, in the DLA read operation in the first modification of the second embodiment, the setting of the time during which the control signal XXL is maintained at the "H" level in the second read is switched between the time T1 and the time T2, as in the first modification of the first embodiment. Further, in the second read of the DLA read operation in the first modification of the second embodiment, the voltage applied to the word line WLn+1 connected to the adjacent memory cell has been replaced with VREADH and VREADL at the time of reading the first data. That is, the sequencer 13 in the first modification of the second embodiment executes the data determination process in the order of the second data and the first data in the read process of each state in the second read. Other operations in the first modification of the second embodiment are similar to those of the first embodiment.

Even in such a case, the semiconductor storage device according to the first modification of the second embodiment may selectively use the read result of the second read used in the calculation of the read data based on the result of the first read, as in the second embodiment. Therefore, the semiconductor storage device 1 according to the first modification of the second embodiment may prevent the occurrence of read errors and improve the reliability of the semiconductor storage device 1 as in the second embodiment.

Second Modification of Second Embodiment

Figure 20:
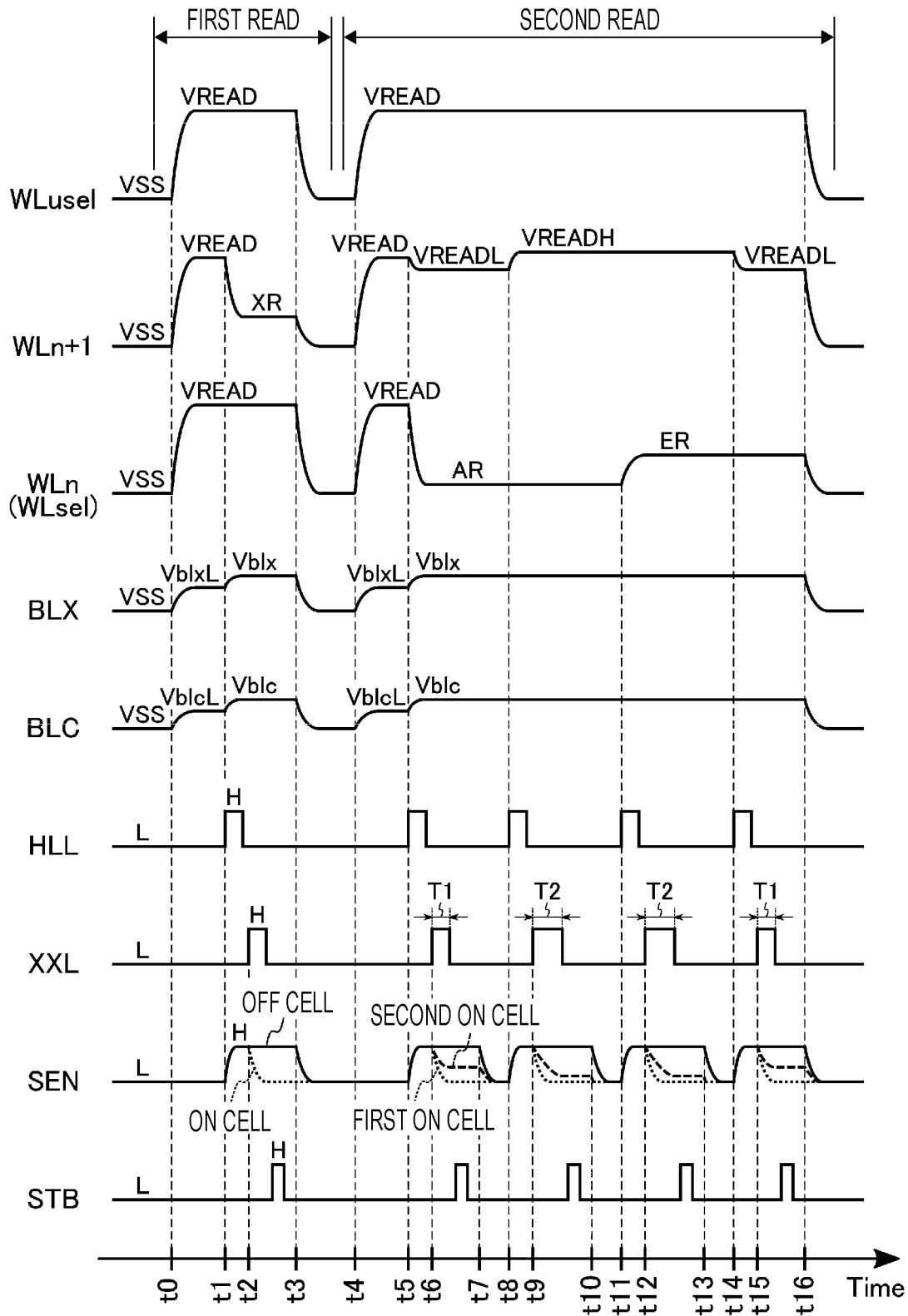
FIG. 20 is a timing chart illustrating an example of a DLA read operation in a semiconductor storage device according to a second modification of the second embodiment.

FIG. 20 illustrates an example of a timing chart of the DLA read operation in the semiconductor storage device according to the second modification of the second embodiment. As illustrated in FIG. 20, the DLA read operation in the second modification of the second embodiment has a different configuration from the DLA read operation in the second embodiment in the settings corresponding to the two data determination processes executed in each state in the second read.

Specifically, the sequencer 13 in the second modification of the second embodiment executes the determination process in the order of the first data and the second data in the read process of the first state in the second read. Then, the sequencer 13 executes the determination process in the order of the second data and the first data in the subsequent state read process. As described above, in the second modification of the second embodiment, the determination process of the second data in the read process of the first state and the determination process of the second data in the read process of the subsequent state are consecutive. Therefore, VREADH is continuously applied to the word line WLn+1 connected to the adjacent memory cell, for example, at times t8 to t14 of the second read. Other operations in the second modification of the second embodiment are similar to those of the first modification of the second embodiment.

Even in such a case, the semiconductor storage device according to the second modification of the second embodiment may selectively use the read result of the second read used in the calculation of the read data based on the result of the first read, as in the second embodiment. Therefore, the semiconductor storage device 1 according to the second modification of the second embodiment may prevent the occurrence of read errors and improve the reliability of the semiconductor storage device 1 as in the second embodiment.

[3] Third Embodiment

The semiconductor storage device 1 according to the third embodiment has the same configuration as the semiconductor storage device 1 according to the first embodiment. Then, the semiconductor storage device 1 according to the third embodiment executes the DLA read operation in which a part of the charging process of the node SEN is omitted. Hereinafter, the semiconductor storage device 1 according to the third embodiment will be described regarding the differences from the first and second embodiments.

[3-1] DLA Read Operation

Figure 21:
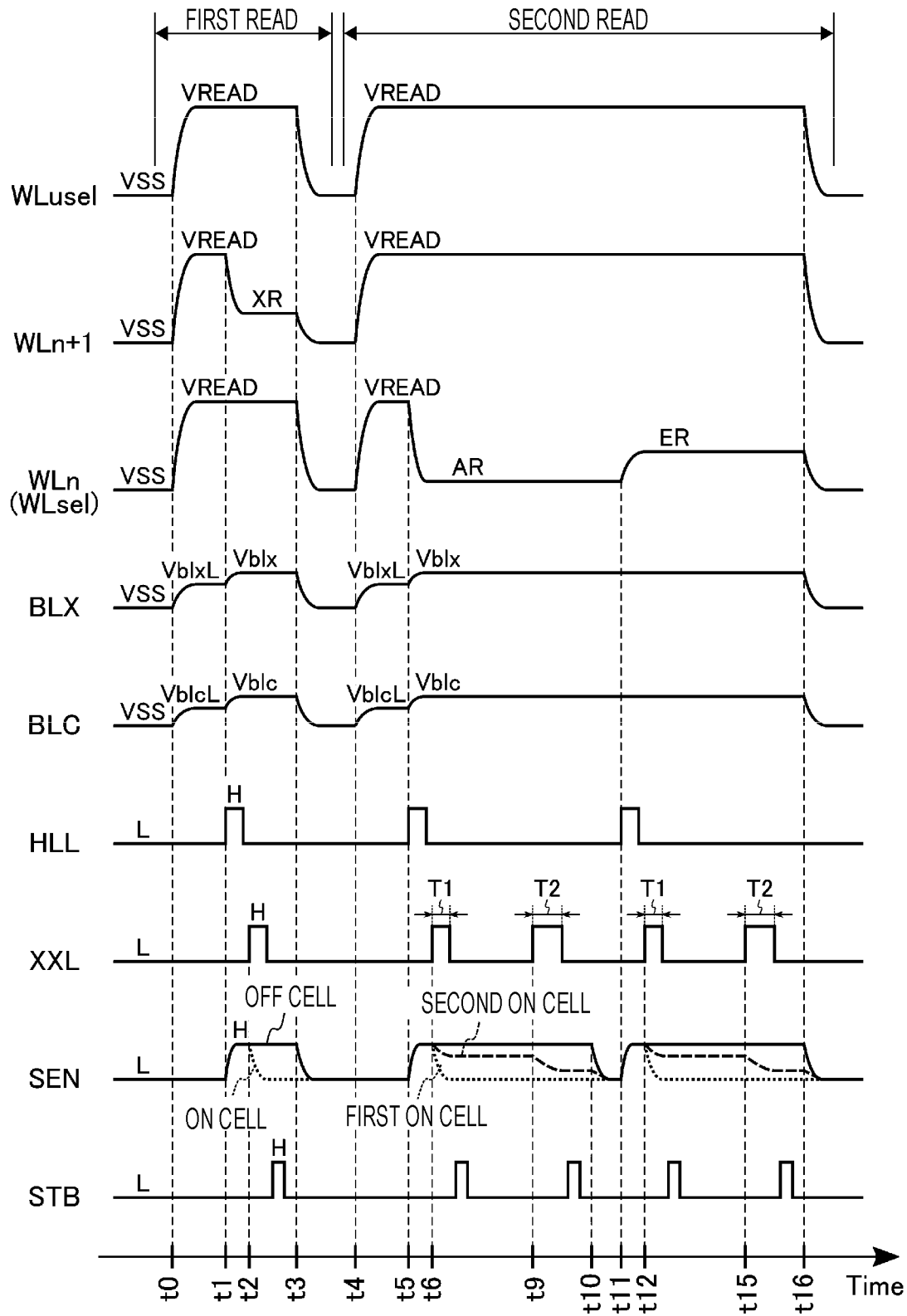
FIG. 21 is a timing chart illustrating an example of a DLA read operation in a semiconductor storage device according to a third embodiment.

Hereinafter, a specific example of the DLA read operation in the semiconductor storage device 3 according to the third embodiment will be described as a representative of reading the lower page data. FIG. 21 illustrates an example of a timing chart of the DLA read operation of lower page data in the semiconductor storage device 1 according to the third embodiment. As illustrated in FIG. 21, the DLA read operation in the third embodiment has a configuration in which the processes at times t7, t8, t13, and t14 are omitted from the DLA read operation in the first embodiment.

Specifically, in the second read of the DLA read operation in the third embodiment, for example, the voltage of the node SEN at time t9 maintains the state of being discharged by the process at time t6. Then, the voltage of the node SEN is continuously discharged from this state by the process at time t9 similar to the first embodiment. Therefore, in the third embodiment, the voltage of the node SEN connected to the second ON cell corresponding to the read voltage AR becomes lower than the threshold voltage of the transistor 26 by the process at time t9, as in the first embodiment.

Similarly, in the second read of the DLA read operation in the third embodiment, for example, the voltage of the node SEN at time t15 maintains the state of being discharged by the process at time t12. Then, the voltage of the node SEN is continuously discharged from this state by the process at time t15 similar to the first embodiment. Therefore, in the third embodiment, the voltage of the node SEN connected to the second ON cell corresponding to the read voltage ER becomes lower than the threshold voltage of the transistor 26 by the process at time t15, as in the first embodiment. Other operations in the third embodiment are similar to those in the first embodiment.

Meanwhile, although FIG. 21 illustrates a case where the discharge time of the node SEN in each process at the times t9 and t15 is "T2", the present disclosure is not limited thereto. In the DLA read operation of the third embodiment, in the read process of each state in the second read, the discharge time "T1" of the node SEN related to the first data determination process may be the same as the first embodiment, and a sum of the discharge time of the node SEN related to the second data determination process and "T1" may be set to be at least the discharge time "T2" or more in the first embodiment.

[3-2] Effect of Third Embodiment

As described above, in the DLA read operation of the semiconductor storage device 1 according to the third embodiment, the charging process of the node SEN in the second read is partially omitted. Then, in the read process of each state of the second read of the DLA read operation in the third embodiment, the discharging of the node SEN related to the second data determination process starts from the discharging state of the node SEN related to the first data determination process.

Even in such a case, the semiconductor storage device 1 according to the third embodiment may selectively use the read result of the second read used in the calculation of the read data based on the result of the first read, as in the first embodiment. Further, the processing time of the second read in the third embodiment may be shortened because a part of the process is omitted. Therefore, the semiconductor storage device 1 according to the third embodiment may prevent the occurrence of read errors as in the first embodiment, and may shorten the DLA read operation time as compared with the first embodiment.

[4] Other Modifications

In the above embodiments, the case where the DLA data is 1-bit data has been described, but the present disclosure is not limited thereto. The DLA read operation may use a plurality of bits of DLA data. In this case, in the first read in the DLA read operation, a read process of a plurality of bits is executed. The read voltage used in the multi-bit read process may be the same as or different from the read voltage used in the normal read operation. For example, in the second read when a plurality of bits of DLA data is used, the sequencer 13 executes the data determination process three times or more in the read process of each state. A plurality of read results of each state by the second read is associated with a plurality of bits of DLA data. Then, the sequencer 13 selects the read result of the second read used for the calculation of the read data based on the DLA data of a plurality of bits, and determines the read data. As a result, the semiconductor storage device 1 may improve a detection accuracy of the threshold voltage of the adjacent memory cell, and may more accurately correct the effective threshold voltage of the selected memory cell.

The above-described embodiments and modifications may be combined within a possible range. For example, switching the order of the first read and the second read in the DLA read operation as in the second modification of the first embodiment may be applied to each of the second and third embodiments. Changing the order of applying the read voltage in the second read as in the third modification of the first embodiment may be applied to each of the second and third embodiments. Further, three or more types of embodiments and modifications may be combined with each other. As a result, the semiconductor storage device 1 may obtain the respective effects of the combined embodiments and modifications.

In the above embodiments, the case where the normal read operation and the DLA read operation are selectively used depending on the command sequence has been described, but the present disclosure is not limited thereto. The DLA read operation may be executed according to the mode of the semiconductor storage device 1. In this case, the memory controller 2 instructs the semiconductor storage device 1 to change to the mode in which the DLA read operation is executed in the read operation. Then, the semiconductor storage device 1 in the mode for executing the DLA read operation executes the DLA read operation based on, for example, receiving the command sequence used for the normal read operation described in the first embodiment.

The timing chart used to describe the write operation in the above embodiments is merely an example. For example, the timing of controlling the voltage of the signal and the voltage of the wiring at each time may be different. In the DLA read operation, the operation between times t0 and t1 and the operation between times t4 and t5 may be omitted. In the above embodiments, the voltage applied to various wirings in the memory cell array 10 may be estimated based on the voltage of the signal line between the driver module 14 and the row decoder module 15. For example, the voltage applied to the word line WLsel may be estimated based on the voltage of the signal line CG.

In the present specification, the phrase "one end of a transistor" refers to a drain or a source of a MOS transistor. The phrase "the other end of a transistor" indicates the source or drain of the MOS transistor. The term "connect" means an electrical connection, and does not exclude, for example, another element interposed between elements. The phrase "OFF state" indicates that a voltage lower than the threshold voltage of the transistor is applied to the gate of the corresponding transistor, and does not exclude the flow of a minute current such as a leak current of the transistor.

In the present specification, the "H" level voltage is a voltage at which the N-type MOS transistor having a gate applied with the voltage is turned on, and the P-type MOS transistor having a gate applied with the voltage is turned off. The "L" level voltage is a voltage at which the N-type MOS transistor having a gate applied with the voltage is turned off and the P-type MOS transistor having a gate applied with the voltage is turned on. The term "assert" corresponds to the sequencer 13 temporarily changing control signal of a target from the "L" level to the "H" level. The "time during which the sense node is discharged through the transistor 23" corresponds to, for example, the period during which the control signal XXL is at the "H" level and the transistor 23 is in the ON state.

While certain embodiments have been described, these embodiments have been presented by way of example only, and are not intended to limit the scope of the present disclosures. Indeed, the novel embodiments described herein may be embodied in a variety of other forms; furthermore, various omissions, substitutions and changes in the form of the embodiments described herein may be made without departing from the spirit of the present disclosures. The accompanying claims and their equivalents are intended to cover such forms or modifications as would fall within the scope and spirit of the present disclosures.

What is claimed is:

1. A semiconductor storage device comprising:
    a first memory cell and a second memory cell connected in series;
    a first word line connected to the first memory cell;
    a second word line connected to the second memory cell;
    a bit line connected to the first and second memory cells connected in series;
    a sense amplifier including a sense node and a transistor connected between the sense node and the bit line; and
    a controller configured to execute a read operation including a first read and a second read,
    wherein in the read operation in which the first word line is selected, the controller
    applies a first read voltage to the second word line during the first read,
    discharges the sense node through the transistor while applying the first read voltage, and determines a read result of the second memory cell based on a voltage of the discharged sense node,
    applies a second read voltage to the first word line during the second read,
    discharges the sense node through the transistor for a first time period while applying the second read voltage, and determines a first read result of the first memory cell based on a voltage of the sense node discharged for the first time period,
    discharges the sense node through the transistor for a second time period different from the first time period, and determines a second read result of the first memory cell based on a voltage of the sense node discharged for the second time period, and based on a read result of the second memory cell, outputs read data based on the first read result or the second read result of the first memory cell to an external memory controller.

2. The semiconductor storage device according to claim 1, wherein in the read operation, the controller during the first read, applies a first read pass voltage higher than each of the first and second read voltages to the first word line while discharging the sense node through the transistor, and during the second read, applies a second read pass voltage higher than each of the first and second read voltages to the second word line while discharging the sense node for the first time period and discharging the sense node for the second time period, respectively.

3. The semiconductor storage device according to claim 2, wherein in the read operation, the controller determines the second read result of the first memory cell after determining the first read result of the first memory cell, and continuously applies the second read pass voltage to the second word line during the first time period, during the second time period, and between the first time period and the second time period.

4. The semiconductor storage device according to claim 3, wherein during the second read, the controller charges the sense node before discharging the sense node for the first time period, and does not charge the sense node after confirming the first read result of the first memory cell and before discharging the sense node for the second time period.

5. The semiconductor storage device according to claim 1, wherein the second memory cell is connected between the first memory cell and the bit line, and the second memory cell is arranged adjacent to the first memory cell such that there is no other memory cell between the first memory cell and the second memory cell.

6. The semiconductor storage device according to claim 5, wherein prior to the read operation, data were written in a plurality of memory cells including the second memory cell after data were written in a plurality of memory cells including the first memory cell.

7. The semiconductor storage device according to claim 1, wherein the second time period is longer than the first time period, and in the read operation, when the read result of the second memory cell indicates that a threshold voltage of the second memory cell is equal to or lower than the first read voltage, the controller outputs the read data based on the first read result of the first memory cell to the memory controller, and when the read result of the second memory cell indicates that the threshold voltage of the second memory cell is higher than the first read voltage, the controller outputs the read data based on the second read result of the first memory cell to the memory controller.

8. The semiconductor storage device according to claim 1, wherein in the read operation, the controller performs the first read and the second read in this order.

9. The semiconductor storage device according to claim 1, wherein in the read operation, the controller performs the second read and the first read in this order.

10. The semiconductor storage device according to claim 1, wherein in the read operation, the controller during the first read, applies a first read pass voltage higher than each of the first and second read voltages to the first word line while discharging the sense node through the transistor, and during the second read, applies a second read pass voltage to the second word line while discharging the sense node for the first time period, and applies a third read pass voltage different from the second read pass voltage to the second word line while discharging the sense node for the second time period.

11. The semiconductor storage device according to claim 10, wherein the second time period is longer than the first time period, and the third read pass voltage is higher than the second read voltage, and wherein in the read operation, when the read result of the second memory cell indicates that a threshold voltage of the second memory cell is equal to or lower than the first read voltage, the controller outputs the read data based on the first read result of the first memory cell to the memory controller, and when the read result of the second memory cell indicates that the threshold voltage of the second memory cell is higher than the first read voltage, the controller outputs the read data based on the second read result of the first memory cell to the memory controller.

12. A method of performing a read operation in a semiconductor storage device including a plurality of memory cells and a plurality of word lines connected to the plurality of memory cells, comprising:

a first step of reading a memory cell connected to an (n+1)th word line at least once, where n is an integer greater than or equal to 1, and memory cells connected to the (n+1)th word line were written after memory cells connected to an nth word line were written; and a second step of reading a memory cell connected to the nth word line at least twice, wherein memory cells of the semiconductor storage device are divided into blocks, and the memory cells connected to the nth word line and the memory cells connected to the (n+1)th word line are in the same block, and in the second step, a time period for discharging a sense node during a first read and a time period for discharging the sense node during a second read are different from each other.

13. The method according to claim 12, wherein the time period for discharging the sense node during the first read is shorter than the time period for discharging the sense node during the second read.

14. The method according to claim 13, wherein the first read is carried out prior to the second read.

15. The method according to claim 13, wherein the second read is carried out prior to the first read.

16. The method according to claim 12, wherein the sense node is charged after the first read and before the second read.

17. The method according to claim 12, wherein the sense node is not charged after the first read and before the second read.

18. The method according to claim 12, wherein during and throughout the second step, a voltage of the (n+1)th word line is maintained constant.

19. The method according to claim 12, wherein during the second step, a voltage of the (n+1)th word line is varied.

20. The method according to claim 12, wherein
in the second step, the voltage of the (n+1)th word line during the first read is different from the voltage of the (n+1)th word line during the second read.

* * * * *